(12) United States Patent
Lu et al.

(10) Patent No.: US 12,211,805 B2
(45) Date of Patent: Jan. 28, 2025

(54) TRENCH STRUCTURE FOR REDUCED WAFER CRACKING

(71) Applicant: Taiwan Semiconductor Manufacturing Company, Ltd., Hsinchu (TW)

(72) Inventors: Chun-Liang Lu, Tainan (TW); Chun-Wei Chia, Kaohsiung (TW); Chun-Hao Chou, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 574 days.

(21) Appl. No.: 17/447,997

(22) Filed: Sep. 17, 2021

(65) Prior Publication Data

US 2022/0310533 A1    Sep. 29, 2022

Related U.S. Application Data

(60) Provisional application No. 63/166,828, filed on Mar. 26, 2021.

(51) Int. Cl.
| H01L 23/48 | (2006.01) |
| H01L 21/56 | (2006.01) |
| H01L 23/00 | (2006.01) |
| H01L 23/31 | (2006.01) |
| H01L 23/58 | (2006.01) |

(52) U.S. Cl.
CPC ........ H01L 23/562 (2013.01); H01L 23/3142 (2013.01); H01L 23/585 (2013.01)

(58) Field of Classification Search
CPC .. H01L 23/585; H01L 23/3142; H01L 23/562
See application file for complete search history.

(56) References Cited

U.S. PATENT DOCUMENTS

| 10,163,750 B2* | 12/2018 | Yu ........................ H01L 25/0657 |
| 2010/0123219 A1* | 5/2010 | Chen ..................... B23K 26/40 |
| | | 257/E23.08 |
| 2011/0278722 A1* | 11/2011 | Miki ...................... H01L 21/78 |
| | | 257/737 |
| 2019/0035683 A1* | 1/2019 | Song ................ H01L 21/76224 |
| 2019/0371741 A1* | 12/2019 | Wang .................. H01L 21/6835 |

* cited by examiner

*Primary Examiner* — Hoa B Trinh
(74) *Attorney, Agent, or Firm* — Harrity & Harrity, LLP

(57) ABSTRACT

A semiconductor device includes a first wafer comprising a first portion of a seal ring structure within a body of the first wafer. The semiconductor device includes a second wafer comprising a second portion of the seal ring structure within a body of the second wafer. The second wafer is affixed to the first wafer such that the second portion of the seal ring structure is on the first portion of the seal ring structure. The semiconductor device includes a trench structure comprising a first trench in the first wafer and a second trench in the second wafer, where the first trench and the second trench are on a same side of the seal ring structure.

20 Claims, 34 Drawing Sheets

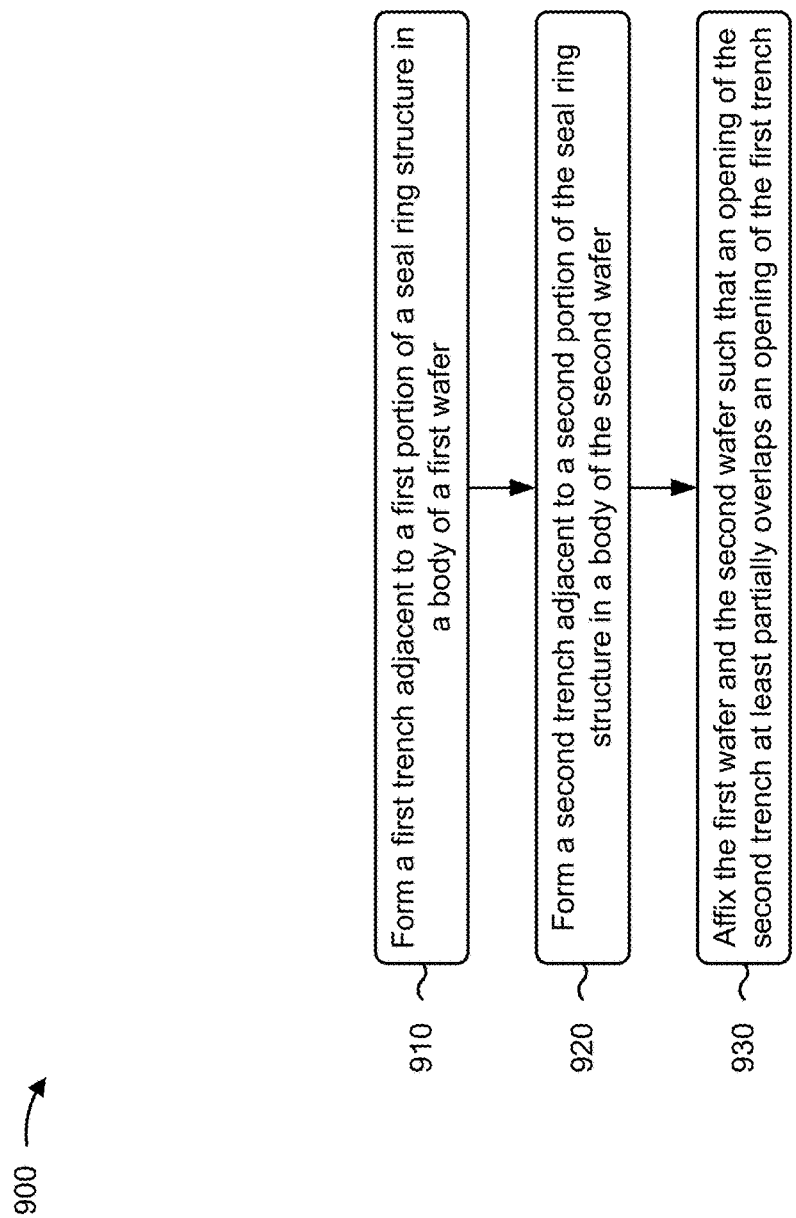

TRENCH STRUCTURE FOR REDUCED WAFER CRACKING

CROSS-REFERENCE TO RELATED APPLICATION

This patent application claims priority to U.S. Provisional Patent Application No. 63/166,828, filed on Mar. 26, 2021, and entitled "TRENCH STRUCTURE FOR REDUCED WAFER CRACKING." The disclosure of the prior Application is considered part of and is incorporated by reference into this patent application.

BACKGROUND

A semiconductor device, such as a complementary metal-oxide-semiconductor (CMOS) integrated circuit (e.g., a CMOS image sensor) may comprise multiple semiconductor dies which are stacked upon one another. Generally, such a semiconductor device includes a seal ring structure. A seal ring structure is a structure formed between a scribe line and a semiconductor device circuit and is designed, in part, to reduce or prevent wafer cracking from occurring when cutting or sawing a wafer of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a flowchart of an example process relating to forming a trench structure.

DETAILED DESCRIPTION

Figure 1:
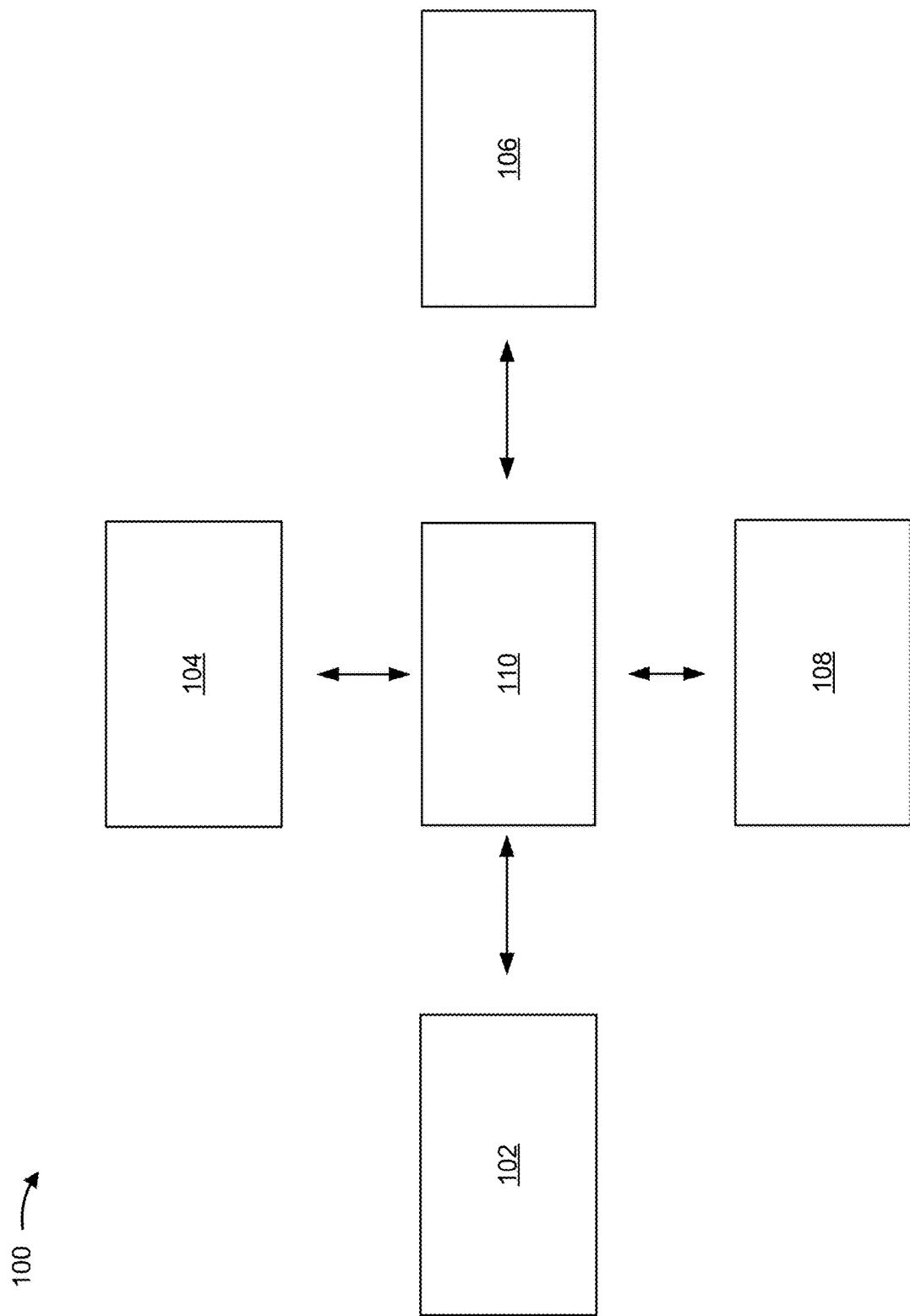
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A seal ring structure can be formed between a scribe line and a semiconductor device circuit. The seal ring structure may be designed, in part, to reduce or prevent wafer cracking from occurring during cutting or sawing of a wafer of the semiconductor device. However, a seal structure may not sufficiently protect from wafer cracking in the presence of cutting or sawing stress, particularly when semiconductor wafers are affixed to one another (e.g., stacked and bonded together) to form the semiconductor device. For example, a CMOS integrated circuit (e.g., a CMOS image sensor) may include a first wafer (e.g., an application-specific integrated circuit (ASIC)) and a second wafer (e.g., a system on chip (SOC)), where the first wafer and the second wafer are bonded at an interface in association with forming the CMOS integrated circuit. Here, a seal ring structure can be formed in the first wafer and/or the second wafer (e.g., around perimeter of the CMOS integrated circuit). However, due to the presence of the bonded interface, reliability, die-sawing stress reduction, and/or contamination prevention provided by the seal ring structure may be inadequate. Notably, wafer cracking is increasingly likely as a size of the semiconductor device becomes smaller.

Some implementations described herein provide a trench structure for reducing or preventing wafer cracking. For example, in some implementations, a semiconductor device, may include a first wafer comprising a first portion of a seal ring structure within a body of the first wafer, and a second wafer comprising a second portion of the seal ring structure within a body of the second wafer. Here, the second wafer is affixed to the first wafer such that the second portion of the seal ring structure is over the first portion of the seal ring structure. The semiconductor device further includes a trench structure comprising a first trench in the first wafer and a second trench in the second wafer, with the first trench and the second trench being on a same side of the seal ring structure in the body of the first wafer and the second wafer, respectively.

In some implementations, the trench structure described herein improves reliability of the seal ring structure, reduces stress induced in the semiconductor device during a sawing or cutting process, and/or provides protection for the seal ring structure (e.g., from damage during wafer sawing or cutting by acting as a sawing or cutting stop layer). For example, in some implementations, the trench structure reduces stress (e.g., induced due to stress from a die sawing or cutting process) at the interface of the first wafer and the second wafer, thereby improving reliability and reducing stress at the interface and, as a result, reducing a likelihood of wafer cracking. As another example, the trench structure may permit some degree of expansion or contraction (e.g., induced due to thermal conditions) of the first wafer or the second wafer, thereby improving reliability and reducing stress at the interface and, as a result, reducing a likelihood of wafer cracking. Further, the trench structure described herein can improve contamination prevention (e.g., by preventing contaminants from penetrating the semiconductor device circuit). For these reasons, the trench structure described can improve manufacturing yield of a semiconductor device, such as a CMOS integrated circuit, and reduce manufacturing downtime.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, a bonding tool 108, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The bonding tool 108 is a semiconductor processing tool that is capable of bonding two or more wafers (or two or more semiconductor substrates, or two or more semiconductor devices) together. For example, the bonding tool 108 may include a eutectic bonding tool that is capable of forming a eutectic bond between two or more wafers. In these examples, the bonding tool 108 may heat the two or more wafers to form a eutectic system between the materials of the two or more wafers.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, or another location. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
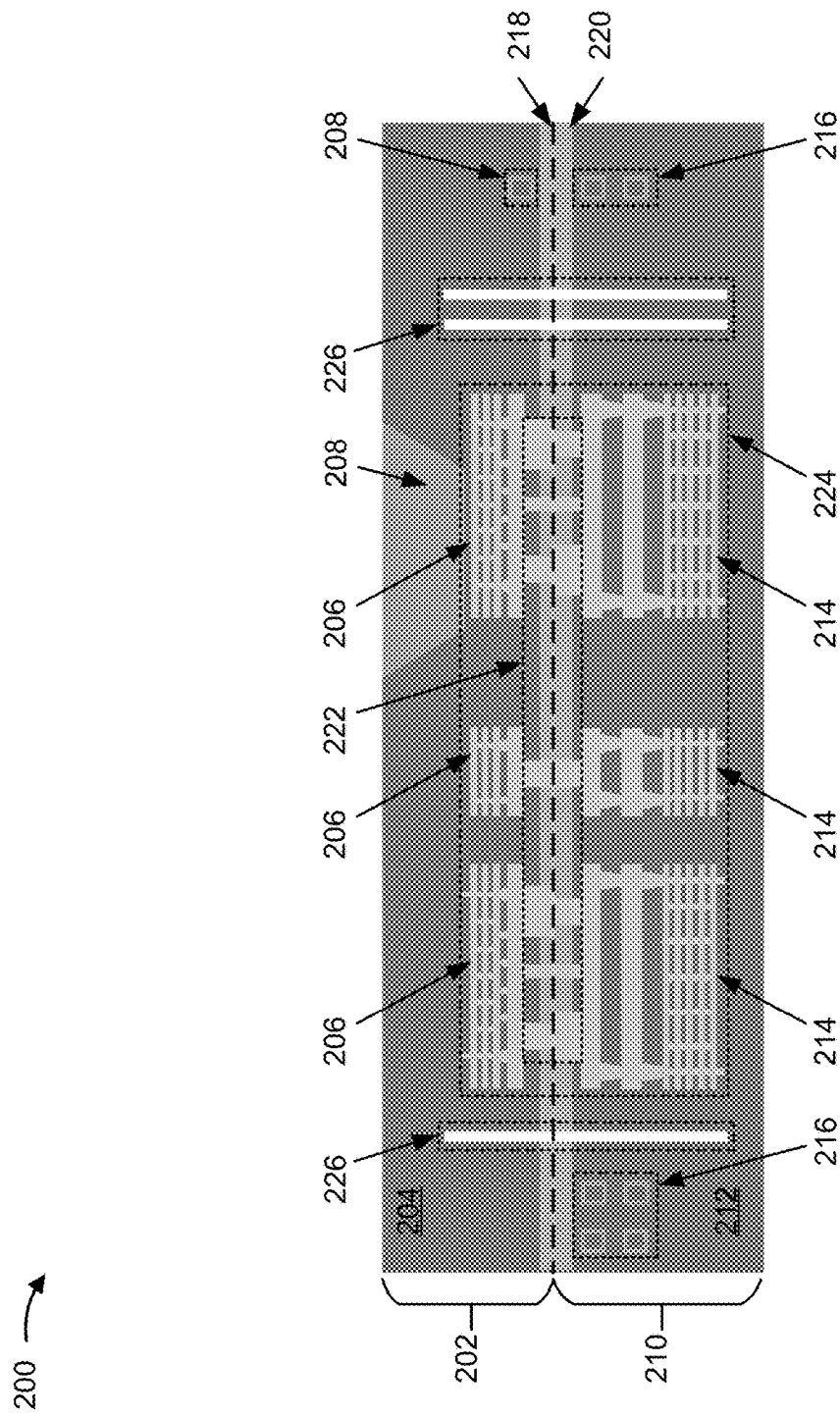
FIG. 2 is a diagram of an example semiconductor device described herein.

FIG. 2 is a diagram of an example semiconductor device 200 described herein. FIG. 2 shows a first wafer bonded to a second wafer in which a trench structure is around a seal ring structure formed within the first wafer and the second wafer. In some implementations, the semiconductor device 200 includes one or more layers not shown in FIG. 2, such as one or more barrier layers, adhesion layers, metal gates, substrates, interconnects, recesses (e.g., vias), or semiconductor structures, among other examples. In some implementations, the semiconductor device 200 may include, or may be included within, a complementary metal-oxide-semiconductor (CMOS) image sensor (CIS), a 3-dimensional integrated circuit (IC), or a 3-dimensional resistive random access memory device (3D RRAM), among other examples.

As shown FIG. 2, the semiconductor device 200 includes a first wafer 202 bonded to a second wafer 210. In some implementations, the first wafer 202 and/or the second wafer 210 may include an SOC or an ASIC. For example, the first wafer 202 may include one of an SOC or an ASIC and the second wafer 210 may include the other of an SOC or an ASIC, both of the first wafer 202 and the second wafer 210 may include an SOC, or both of the first wafer 202 and the second wafer 210 may include an ASIC, among other configurations.

As shown in FIG. 2, the semiconductor device includes the first wafer 202 having a body 204 and a second wafer 210 having a body 212. The first wafer 202 includes, in the body 204, one or more metal structures 206 and one or more semiconductor structures 208. The second wafer 210 includes, in the body 212, one or more metal structures 214 and one or more semiconductor structures 216. As further shown, the first wafer 202 and the second wafer 210 are bonded at an interface 218 in a bond region 220. The semiconductor device 200 further includes a metal bonding structure 222, where elements of the metal bonding structure 222 are between portions of a seal ring structure 224. The semiconductor device 200 further includes a trench structure 226 (e.g., one or more trenches on one or more sides of the seal ring structure 224).

The first wafer 202 may include, in the body 204, one or more layers of materials, such as dielectric materials, polysilicon materials, and/or a substrate material. The dielectric materials may include one or more inter-metal dielectrics, one or more inter-layer dielectrics, or one or more dielectric bonding structures, among other dielectric semiconductor structures. For example, the dielectric materials may include a polymer layer, a silicon nitride layer, and/or a silicon dioxide layer (e.g., on a bottom surface of the body 204 to facilitate bonding), among other examples. The polysilicon materials may include, or may be included in, one or more semiconductor devices, such as a transistor (e.g., as a gate of the transistor). The substrate material may be used for a semiconductor die substrate, a semiconductor wafer, or another type of substrate in and/or on which semiconductor devices may be formed. In some implementations, the substrate material is formed of silicon (Si), a material including silicon, a III-V compound semiconductor material such as gallium arsenide (GaAs), a silicon on insulator (SOI), or another type of semiconductor material.

The one or more metal structures 206 may include multiple layers of metal material and/or may be disposed within multiple layers of the body 204. In some implementations, the one or more metal structures 206 may be elements of the seal ring structure 224 of the semiconductor device 200. In some implementations, the one or more metal structures 206 provide a lattice structure within the body 204. In some implementations, a metal structure 206 of the one or more metal structures 206 has a width (e.g., in a direction of layers of the first wafer 202, as shown in a left-right direction in FIG. 2) that is greater than a thickness of the one or more metal structures 206 (e.g., in a direction orthogonal to the direction of layers of the first wafer 202, as shown in an up-down direction in FIG. 2). Additionally, or alternatively, the width may extend in a direction that is parallel to the top surface of the body 204 of the first wafer 202. In some implementations, a width of a metal structure 206 may be in a range from approximately 100 nanometers (nm) to approximately 500 nm. However, other values for the width of a metal structure 206 are within the scope of the present disclosure. In some implementations, the one or more metal structures 206 are embedded within the body 204 at a depth (e.g., as measured from a bottom surface of the first wafer 202 in FIG. 2) that is less than the width of the one or more metal structures 206. In this way, the one or more metal structures 206 may provide an anchor for the first wafer 202 to which elements of the metal bonding structure 222 may be connected to provide structural support for the semiconductor device 200.

In some implementations, a first metal structure 206 of the one or more metal structures 206 is embedded at a first depth, has a first width, and has a first thickness and a second metal structure 206 of the one or more metal structures 206 is embedded at a second depth, has a second width, and has a second thickness with one or more of the second depth, the second width, and/or the second thickness being different from one or more of the first depth, the first width, and/or the first thickness, respectively. In some implementations, the one or more metal structures 206 include copper material, tungsten material, cobalt material, and/or ruthenium material, among other metal materials. In some implementations, the one or more metal structures 206 may be a component of the seal ring structure 224 of the semiconductor device 200.

The one or more semiconductor structures 208 may include, for example, a deep trench structure, a shallow trench structure, a logic device, a transistor structure, or another type of semiconductor structure. In some implementations, the one or more semiconductor structures 208 are insulated from the one or more metal structures 206 and/or provide insulation to the one or more metal structures 206. In this way, the one or more metal structures 206 may provide structural support to the semiconductor device 200 without increasing a likelihood of shorting between the one or more semiconductor structures 208.

The second wafer 210 may include, in the body 212, one or more layers of materials, such as dielectric materials, polysilicon materials, and/or a substrate material. The dielectric materials may include one or more inter-metal dielectrics, one or more inter-layer dielectrics, or one or more dielectric bonding structures, among other dielectric semiconductor structures. For example, the dielectric materials may include a polymer layer, a silicon nitride layer, and/or a silicon dioxide layer (e.g., on a top surface of the body 212 to facilitate bonding), among other examples. The polysilicon materials may include, or may be included in, one or more semiconductor devices, such as a transistor (e.g., as a gate of the transistor). The substrate material may be used for a semiconductor die substrate, a semiconductor wafer, or another type of substrate in and/or on which semiconductor devices may be formed. In some implementations, the substrate is formed of silicon, a material including silicon, a III-V compound semiconductor material such as gallium arsenide, a silicon on insulator, or another type of semiconductor material.

The one or more metal structures 214 may include multiple layers of metal material and/or may be disposed within multiple layers of the body 212. In some implementations, the one or more metal structures 214 may be elements of the seal ring structure 224 of the semiconductor device 200. In some implementations, the one or more metal structures 214 may provide a lattice structure within the body 212. In some implementations, the one or more metal structures 214 may include a first quantity of layers of metal material that is different from a second quantity of layers of metal material of the one or more metal structures 214. In some implementations, a metal structure 214 of the one or more metal structures 214 has a width that is greater than a thickness of the one or more metal structures 206. Additionally, or alternatively, the width may extend in a direction that is parallel to the top surface of the body 212 of the second wafer 210. In some implementations, a width of a metal structure 214 may be in a range from approximately 100 nm to approximately 500 nm. However, other values for the width of a metal structure 214 are within the scope of the present disclosure. In some implementations, the one or more metal structures 214 are embedded within the body 212 at a depth (e.g., as measured from a top surface of the second wafer 210 in FIG. 2) that is less than the width of the one or more metal structures 214. In this way, the one or more metal structures 214 may provide an anchor for the second wafer 210 to which a metal bonding structure may be connected to provide structural support for the semiconductor device 200.

In some implementations, a first metal structure 214 of the one or more metal structures 214 is embedded at a third depth, has a third width, and has a third thickness and a second metal structure 214 of the one or more metal structures 214 is embedded at a fourth depth, has a fourth width, and has a fourth thickness with one or more of the fourth depth, the fourth width, and/or the fourth thickness being different from one or more of the third depth, the third width, and/or the third thickness, respectively. In some implementations, the one or more metal structures 214 may have depths, thicknesses, and/or lengths that are different from depths, thicknesses and/or lengths of the one or more metal structures 206. In some implementations, the one or more metal structures 214 include copper material, tungsten material, cobalt material, and/or ruthenium material, among other metal materials. In some implementations, the one or more metal structures 214 may be a component of the seal ring structure 224 of the semiconductor device 200.

The one or more semiconductor structures 216 may include, for example, a deep trench structure, a shallow trench structure, a logic device, a transistor structure, or another type of semiconductor structure. In some implementations, the one or more semiconductor structures 216 are insulated from the one or more metal structures 214 and/or provide insulation to the one or more metal structures 214. In this way, the one or more metal structures 214 may provide structural support to the semiconductor device 200 without increasing a likelihood of shorting between the one or more semiconductor structures 216.

The trench structure 226 includes one or more trench elements configured for reducing or preventing wafer cracking of the semiconductor device 200. The trench structure 226 includes one or more trench elements. In some implementations, a trench element, of the one or more trench elements, comprises a trench in the body 204 of the first wafer 202 and a trench in the body 212 of the second wafer 210. For example, in the semiconductor device 200 shown in FIG. 2, the trench structure 226 includes three trench elements, where each trench element includes a trench in the body 212 and a trench in the body 204 (e.g., with the trenches in the body 204 being arranged over corresponding trenches in the body 212).

In some implementations, the trench structure 226 includes a set of trench elements on a first side of the seal ring structure 224 and a set of trench elements on a second (opposite) side of the seal ring structure 224. For example, in the implementation shown in FIG. 2, the trench structure 226 includes two trench elements on a first (right) side of the seal ring structure 224 and one trench element on a second (left) side of the seal ring structure 224. As another example, the trench structure 226 may include one trench element on the first side of the seal ring structure 224 and one trench element on the second side of the seal ring structure 224. As another example, the trench structure 226 may include three trench elements on the first side of the seal ring structure 224 and one trench element on the second side of the seal ring structure 224. As another example, the trench structure 226 may include two trench elements on the first side of the seal ring structure 224 and two trench elements on the second side of the seal ring structure 224. As another example, the trench structure 226 may include three trench elements on the first side of the seal ring structure 224 and two trench elements on the second side of the seal ring structure 224. In some implementations, the quantity of trench elements on a given side of the seal ring structure 224 is based on a size of region between the seal ring structure 224 and one or more semiconductor structures 208. That is, in some implementations, the quantity of trench elements on given side of the seal ring structure 224 may be selected based on an amount of space available on the given side of the seal ring structure 224. In some implementations, including a higher quantity of trench elements on a given side of the seal ring structure 224 improves stress reduction provided by the trench elements on the given side of the seal ring structure 224 (e.g., as compared to including a lower quantity of trench elements on the given side of the seal ring structure 224). Thus, in some implementations, the trench structure 226 may include multiple trench elements on one or more sides of the seal ring structure 224 in order to improve stress reduction or protection provided by the trench structure 226.

In some implementations, an opening of a first trench in a given trench element at least partially overlaps an opening of a second trench of the given trench element. For example, as shown in FIG. 2, an upper trench of a given trench element of the trench structure 226 at least partially overlaps a lower trench of the given trench element of the trench structure 226. In some implementations, the at least partial overlap of the upper and lower trenches of a given trench element enhances stress reduction or protection provided by the trench structure 226 (e.g., as compared to a trench element in which upper and lower trenches do not overlap).

In some implementations, a logical central axis of a trench of the trench structure 226 in the body 204 of the first wafer 202 may be aligned with (e.g., may be centered on) a logical central axis of a corresponding trench of the trench structure 226 in the body 212 of the second wafer 210. That is, in some implementations, the trench in the first wafer 202 may be centered on the corresponding trench in the second wafer 210. Alternatively, in some implementations, a logical central axis of a trench of the trench structure 226 in the body 204 of the first wafer 202 may not be aligned with (e.g., may be offset from) a logical central axis of a corresponding trench of the trench structure 226 in the body 212 of the second wafer 210. In some implementations, the use of a trench of the trench structure 226 in the body 204 of the first wafer 202 that is not centered on the trench in the trench structure 226 in the body 212 of the second wafer 210 enables a process tolerance associated with bonding the first wafer 202 and the second wafer 210 to be more readily satisfied, thereby increasing yield and simplifying manufacture of the semiconductor device 200.

In some implementations, a width of the first trench in the given trench element matches a width of the second trench element of the given trench element. For example, as shown in FIG. 2, an upper trench of a given trench element of the trench structure 226 is approximately equal to a width of a corresponding lower trench element of the trench structure 226. In some implementations, the use of matching widths simplifies manufacture of the semiconductor device 200 by, for example, reducing complexity or adjustment needed when performing an etch operation that is used to form the trenches in the body 204 of the first wafer 202 and the body 212 of the second wafer 210.

In some implementations, a width of the first trench in the given trench element is different from a width of the second trench element of the given trench element. For example, a width of an upper trench of a given trench element of the trench structure 226 may be less than a width of a corresponding lower trench element of the trench structure 226. In some implementations, the use of differing widths (e.g., such that the lower trench is wider than the upper trench)

enables a process tolerance associated with bonding the first wafer 202 and the second wafer 210 to be more readily satisfied, thereby increasing yield and simplifying manufacture of the semiconductor device 200.

In some implementations, a width of a given trench in a trench element of the trench structure 226 may be in a range from approximately 10 nm to approximately 200 nm. However, other values for the width of a given trench in a trench element of the trench structure 226 are within the scope of the present disclosure. In some implementations, a distance between a pair of adjacent trenches (e.g., a pair of adjacent trenches in the body 204, a pair of adjacent trenches in the body 212) may be in a range from approximately 20 nm to approximately 100 nm. However, other values for the distance between adjacent trenches are within the scope of the present disclosure. In some implementations, a distance between an edge of the seal ring structure 224 and a closest trench in a trench element of the trench structure 226 may be in a range from approximately 50 nm to approximately 100 nm. However, other values for the distance between of the seal ring structure 224 and the closest trench are within the scope of the present disclosure.

In some implementations, a depth of a given trench in a trench element of the trench structure 226 extends at least to a surface of a portion of the seal ring structure 224. For example, as illustrated in FIG. 2, a depth of a trench of a given trench element of the trench structure 226 in the body 204 extends past a depth of uppermost surfaces of the metal structures 206 of the seal ring structure 224. Similarly, a depth of a trench of the given trench element of the trench structure 226 in the body 212 extends past a depth of lowermost surfaces of the metal structures 214 of the seal ring structure 224. In some implementations, the depth of the trench extending to at least the surface of the portion of the seal ring structure 224 enhances stress reduction or protection provided by the trench structure 226 by, for example, reducing horizontal stress on the portion of the seal ring structure 224.

In some implementations, a depth of a given trench in a trench element of the trench structure 226 extends at least to a surface of a semiconductor structure 208. For example, as illustrated in FIG. 2, a depth of a trench of a given trench element of the trench structure 226 in the body 204 extends to at least a surface of the semiconductor structure 208 over the seal ring structure 224 (e.g., another trench structure on the surface of the body 204). In some implementations, the depth of the trench extending to at least the surface of the semiconductor structure 208 enhances stress reduction or protection provided by the trench structure 226 by, for example, reducing horizontal stress on the semiconductor structure 208.

In some implementations, a depth of a given trench in a trench element of the trench structure 226 may be approximately 10 to approximately 100 times greater than a width of the given trench. In some implementations, the depth of the given trench is selected based on a depth of a metal structure 206 or a metal structure 214 (e.g., the depth may be selected so as to ensure that the given trench extends to a surface of the metal structure 206 or the metal structure 214).

In some implementations, a given trench in a trench element of the trench structure 226 may have one or more side-surfaces that are substantially perpendicular to a surface of the semiconductor device 200. For example, as shown in FIG. 2, the side-surfaces of the trenches in the trench structure 226 within the body 204 of the first wafer 202 and the side-surfaces of the trenches in the trench structure 226 within the body 212 of the second wafer 210 may be substantially perpendicular to the surfaces of the first wafer 202 and the second wafer 210. Additionally, or alternatively, a given trench in a trench element of the trench structure 226 may have one or more sidewalls that are not substantially perpendicular to the surface of the semiconductor device 200 (e.g., the given trench may have a sloped side-surface). For example, one or more trenches in the trench structure 226 within the body 204 of the first wafer 202 or trenches in the trench structure 226 within the body 212 of the second wafer 210 may have one or more side surfaces that are not substantially perpendicular to the surfaces of the first wafer 202 and the second wafer 210. In some implementations, shapes of trenches in the trench structure 226 may vary among the trenches in the trench structure 226. That is, in some implementations, a given pair of trenches in the trench structure 226 may have differing shapes (e.g., defined by differently configured side-surfaces and/or different widths). Notably, the use of different side-surface configurations or trench shapes in the trench structure 226 allows for different etch recipes or different etch processes to be used to form the trenches of the trench structure 226. In this way, formation of the trench structure 226 may be simplified. For example, because the trenches of the trench structure 226 need not have the same side-surface configuration or the same shape, one or more trenches of the trench structure 226 can be formed concurrently with formation other trenches on the wafer, and different trenches of the trench structure 226 can be formed at different times, using different processes, using different etch recipes, or the like, meaning that formation of the trench structure 226 can be performed without significantly increasing processing steps or processing time.

The first wafer 202 is bonded to the second wafer 210 at an interface 218. For example, in some implementations, elements of the metal bonding structure 222 are coupled to the one or more metal structures 206 and to the one or more metal structures 214 and extend through the interface 218. The metal bonding structure 222 may include a copper-based material, a tungsten-based material, an aluminum-based material, or another metal material. In some implementations, the metal bonding structure 222 includes one or more elements that extend through the interface 218. In some implementations, the one or more elements of the metal bonding structure 222 may extend from the one or more metal structures 206 to the one or more metal structures 214 with an angle that is approximately 90 degrees. In this way, the one or more elements may provide improved structural support when compared to one or more elements disposed at an angle that is less than approximately 60 degrees. In some implementations, a given element of the metal bonding structure 222 includes a first metal portion that extends from a metal structure 206 to the interface 218 and a second metal element that extends from a metal structure 214 to the interface 218, with the first metal element being bonded to the second metal element. In other words, the first metal element may be bonded to the second metal element at the interface 218. In this way, the first wafer 202 may be bonded to the second wafer 210 using a metal bond.

In some implementations, based on the metal bonding structure 222 extending between the metal structure 206 within the body 204 of the first wafer 202 and the metal structure 214 within the body 212 of the second wafer 210, the semiconductor device 200 may reduce cracking at the interface 218 and/or may reduce stress at the interface 218.

In some implementations, the first metal element of a given element of the metal bonding structure 222 may be aligned with the second metal element of the given element of the metal bonding structure 222. In other words, a bonded pair including the first metal element and the second metal element may be aligned with a same logical axis (e.g., may extend along, and be centered on, the same logical axis). In some implementations, the first metal element and the second metal element may be approximately equal in length (e.g., from one of the metal structures 206 or 214 to the interface 218) and/or in width (e.g., along a layer of one of the body 204 or the body 212) and/or may have an approximately equal shape. Alternatively, the one of the first metal element and the second metal element may be approximately equal in length (e.g., from one of the metal structures 206 or 214 to the interface 218), but may have a differing widths and/or may have an approximately equal shape, as illustrated in FIG. 2.

In some implementations, a surface of the body 204 of the first wafer 202 at the interface 218 and a surface of the body 212 of the second wafer 210 at the interface 218 may be bonded using one or more adhesion layers of the body 204 and/or the body 212 at the interface 218. In some implementations, the body 204 may include a structure of multiple dielectric materials that includes a polymer layer, a silicon nitride layer, and/or a silicon dioxide layer, among other example dielectric materials. For example, the structure of multiple dielectric materials may include the silicon dioxide layer at the interface 218 based on the silicon dioxide layer being configured to adhere to the body 212 (e.g., a silicon dioxide layer of the body 212 at the interface 218) using heat bonding. Thus, in some implementations, the first wafer 202 may be bonded to the second wafer 210 using a hybrid bond that includes a metal bond between the elements of the metal bonding structure 222 and a dielectric bond between the body 204 and the body 212 (e.g., using heat bonding). In some implementations, the first wafer 202 may be bonded to the second wafer 210 using a hybrid bond that may be formed at a temperature in a range of approximately 100 degrees Celsius to approximately 300 degrees Celsius. This may conserve energy used to form the hybrid bond when compared with other bonding techniques, which may require temperatures above 300 degrees Celsius.

In some implementations, based on having a hybrid bond between the first wafer 202 and the second wafer 210 at the interface 218 and, the metal bonding structure 222 extending between the one or more metal structures 206 within the body 204 of the first wafer 202 and the one or more metal structures 214 within the body 212 of the second wafer 210, the semiconductor device 200 may further reduce cracking at the interface 218 and/or may further reduce stress at the interface 218.

As indicated above, FIG. 2 is provided as an example. Other examples may differ from what is described with regard to FIG. 2.

FIGS. 3A-3D are diagrams of an example implementation 300 described herein. Example implementation 300 may be an example process for forming the second wafer 210 of the semiconductor device 200. In some implementations, the wafer includes an ASIC or an SOC. The second wafer 210 may include one or more additional devices, structures, and/or layers not shown in FIGS. 3A-3D.

Figure 3A:
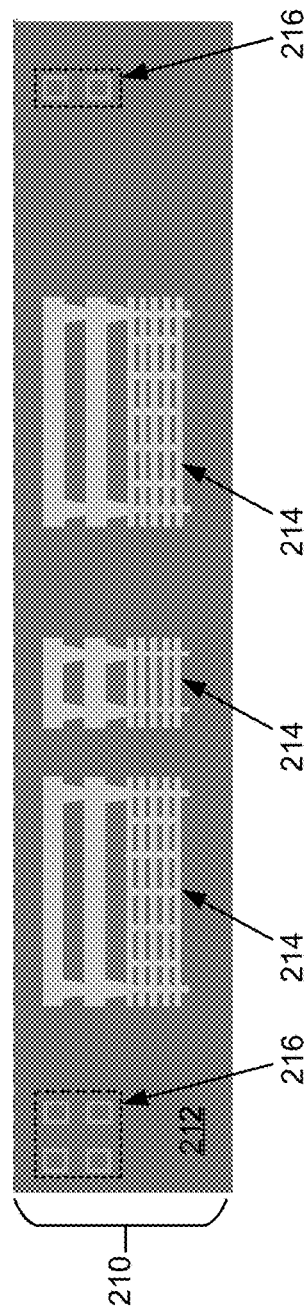
FIGS. 3A-3D are diagrams of an example implementation described herein.

As shown in FIG. 3A, example implementation 300 may include forming one or more metal structures 214 and/or one or more semiconductor structures 216 within a body 212 of the second wafer 210. In some implementations, a deposition tool (e.g., deposition tool 102) deposits materials of the one or more metal structures 214 and/or materials of the one or more semiconductor structures 216 within the body 212 of the second wafer 210. For example, the deposition tool may deposit the materials of the one or more metal structures 214 and/or the materials of the one or more semiconductor structures 216 within recessed portions (e.g., formed based on an etching operation of an etching tool) of the body 212 of the second wafer 210. In some implementations, the deposition tool uses chemical vapor deposition or physical vapor deposition, among other examples, to deposit the materials of the one or more metal structures 214 and/or the materials of the one or more semiconductor structures 216 within recessed portions of the body 212 of the second wafer 210. In some implementations, the deposition tool may deposit one or more layers of the body 212 of the second wafer 210 on and/or between elements of the one or more metal structures 214 and/or the one or more semiconductor structures 216. For example, the deposition tool may deposit one or more dielectric layers on a top surface of the one or more metal structures 214.

In some implementations, a planarization tool (e.g., planarization tool) may polish and/or planarize the body 212 of the second wafer 210 (e.g., after forming the one or more metal structures 214 and/or after depositing one or more layers of the body 212) to form a generally planar top surface of the second wafer 210. In this way, the top surface of the second wafer 210 (e.g., the body 212) may be suitable for bonding to the first wafer 202).

Figure 3B:
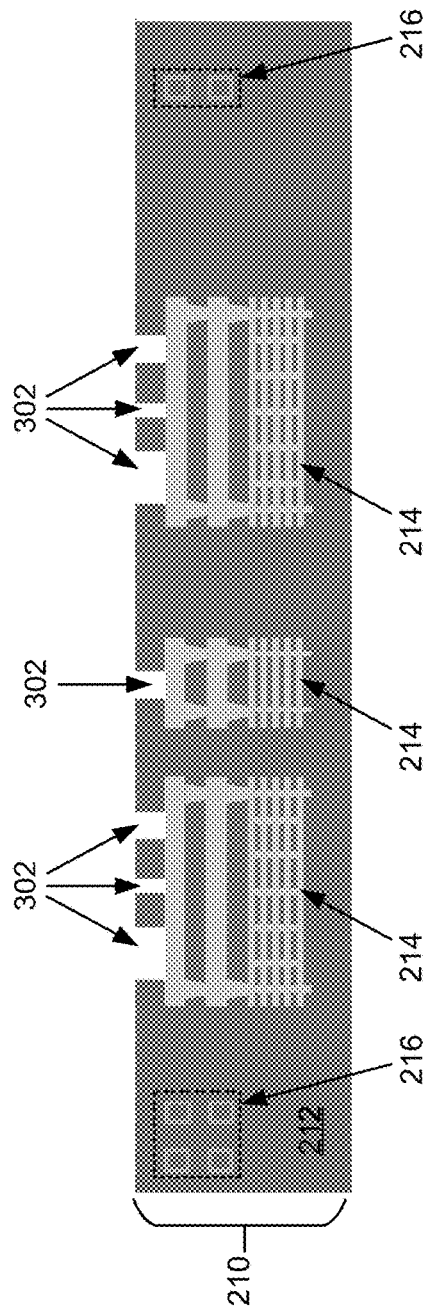

As shown in FIG. 3B, example implementation 300 may include forming a set of recessed portions 302 in a top surface of the body 212 of the second wafer 210. In some implementations, an etching tool (e.g., etching tool 104) may etch one or more portions of the top surface of the body 212 of the second wafer 210 to form the set of recessed portions 302. In some implementations, the etching tool forms the set of recessed portions 302 to extend from the top surface of the body 212 of the second wafer 210 to the one or more metal structures 214.

Figure 3C:
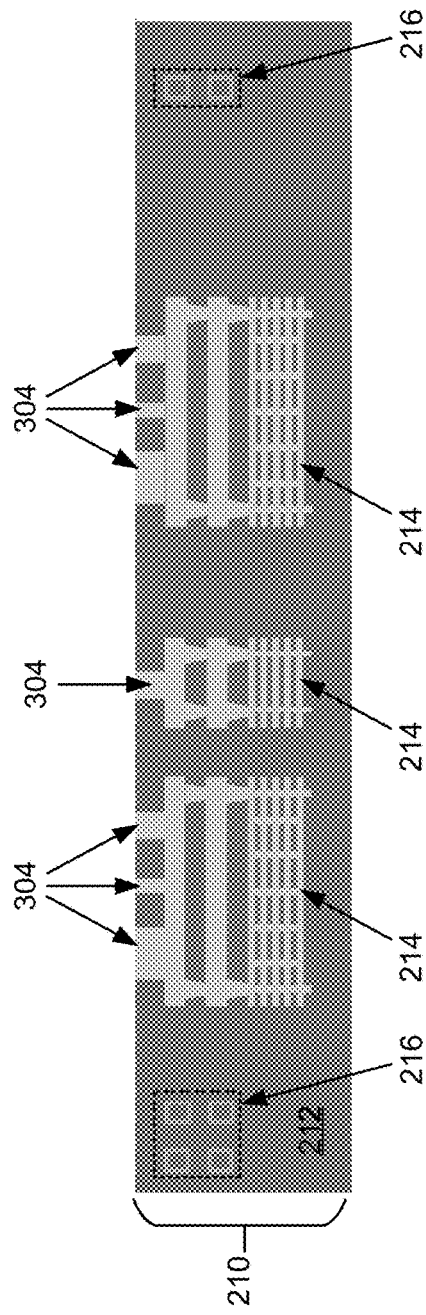

As shown in FIG. 3C, example implementation 300 may include depositing a set of metal elements 304 within the set of recessed portions 302 of the second wafer 210. In some implementations, a deposition tool (e.g., deposition tool 102) deposits material of the set of metal elements 304 within the set of recessed portions 302. In some implementations, the deposition tool uses chemical vapor deposition, physical vapor deposition, and/or reflow, among other examples, to deposit the material of the set of metal elements 304 within the set of recessed portions 302 of the second wafer 210. In some implementations, the deposition tool deposits the set of metal elements 304 in multiple layers. For example, the deposition tool may deposit one or more seed layers (e.g., three seed layers) in a process for depositing the set of metal elements 304. In some implementations, the deposition tool may deposit one or more barrier layers and/or adhesion layers within the set of recessed portions 302 of the second wafer 210 to reduce electromigration of the set of metal elements 304 into the body 212 and/or to reduce peeling of the set of metal elements 304 from the body 212 and/or from the one or more metal structures 214.

Figure 3D:
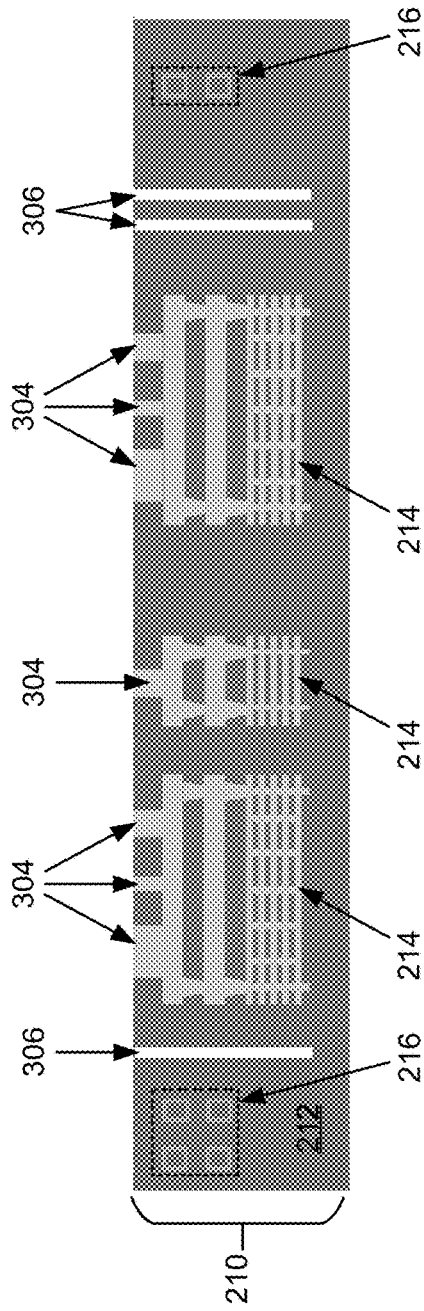

As shown in FIG. 3D, example implementation 300 may include forming a set of trenches 306 in a top surface of the body 212 of the second wafer 210. In some implementations, an etching tool (e.g., etching tool 104) may etch one or more portions of the top surface of the body 212 of the second wafer 210 to form the set of trenches 306. In some implementations, the etching tool forms the set of trenches 306 to extend from the top surface of the body 212 of the second wafer 210 to a depth that extends at least to a depth of a bottom surface of the one or more metal structures 214.

As indicated above, FIGS. 3A-3D are provided as an example. Other examples may differ from what is described with regard to FIGS. 3A-3D.

FIGS. 4A-4D are diagrams of an example implementation 400 described herein. Example implementation 400 may be an example process for forming the first wafer 202 of the semiconductor device 200. In some implementations, the wafer includes an SOC or an ASIC. The first wafer 202 may include one or more additional devices, structures, and/or layers not shown in FIGS. 4A-4D.

Figure 4A:
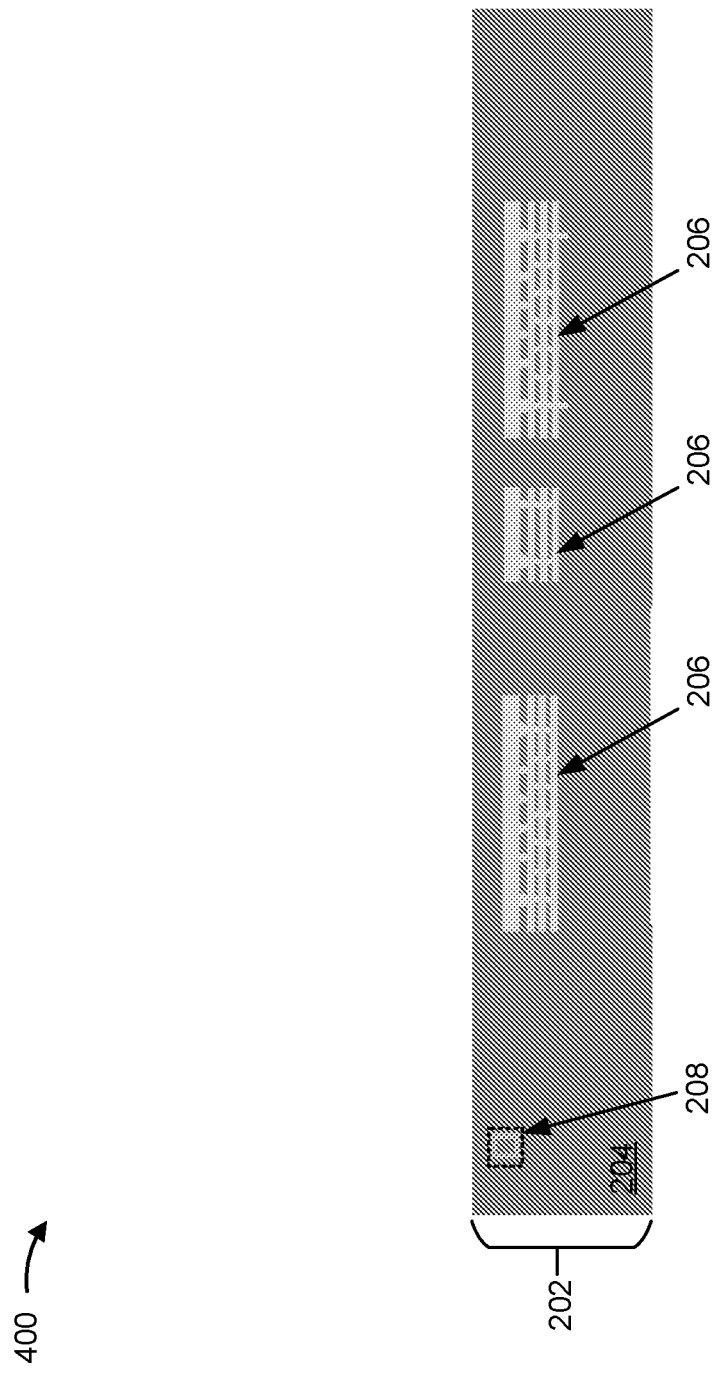
FIGS. 4A-4D are diagrams of an example implementation described herein.

As shown in FIG. 4A, example implementation 400 may include forming one or more metal structures 206 and/or one or more semiconductor structures 208 within a body 204 of the first wafer 202. In some implementations, a deposition tool (e.g., deposition tool 102) deposits materials of the one or more metal structures 206 and/or materials of the one or more semiconductor structures 208 within the body 204 of the first wafer 202. For example, the deposition tool may deposit the materials of the one or more metal structures 206 and/or the materials of the one or more semiconductor structures 208 within recessed portions (e.g., formed based on an etching operation of an etching tool) of the body 204 of the first wafer 202. In some implementations, the deposition tool uses chemical vapor deposition or physical vapor deposition, among other examples, to deposit the materials of the one or more metal structures 206 and/or the materials of the one or more semiconductor structures 208 within recessed portions of the body 204 of the first wafer 202. In some implementations, the deposition tool may deposit one or more layers of the body 204 of the first wafer 202 on, and/or or between, elements of the one or more metal structures 206 and/or the one or more semiconductor structures 208. For example, the deposition tool may deposit one or more dielectric layers on a top surface of the one or more metal structures 206.

In some implementations, a planarization tool (e.g., planarization tool) may polish and/or planarize the body 204 of the first wafer 202 (e.g., after forming the one or more metal structures 206 and/or after depositing one or more layers of the body 204) to form a generally planar top surface of the first wafer 202. In this way, the top surface of the first wafer 202 (e.g., the body 204) may be suitable for bonding to the second wafer 210.

Figure 4B:
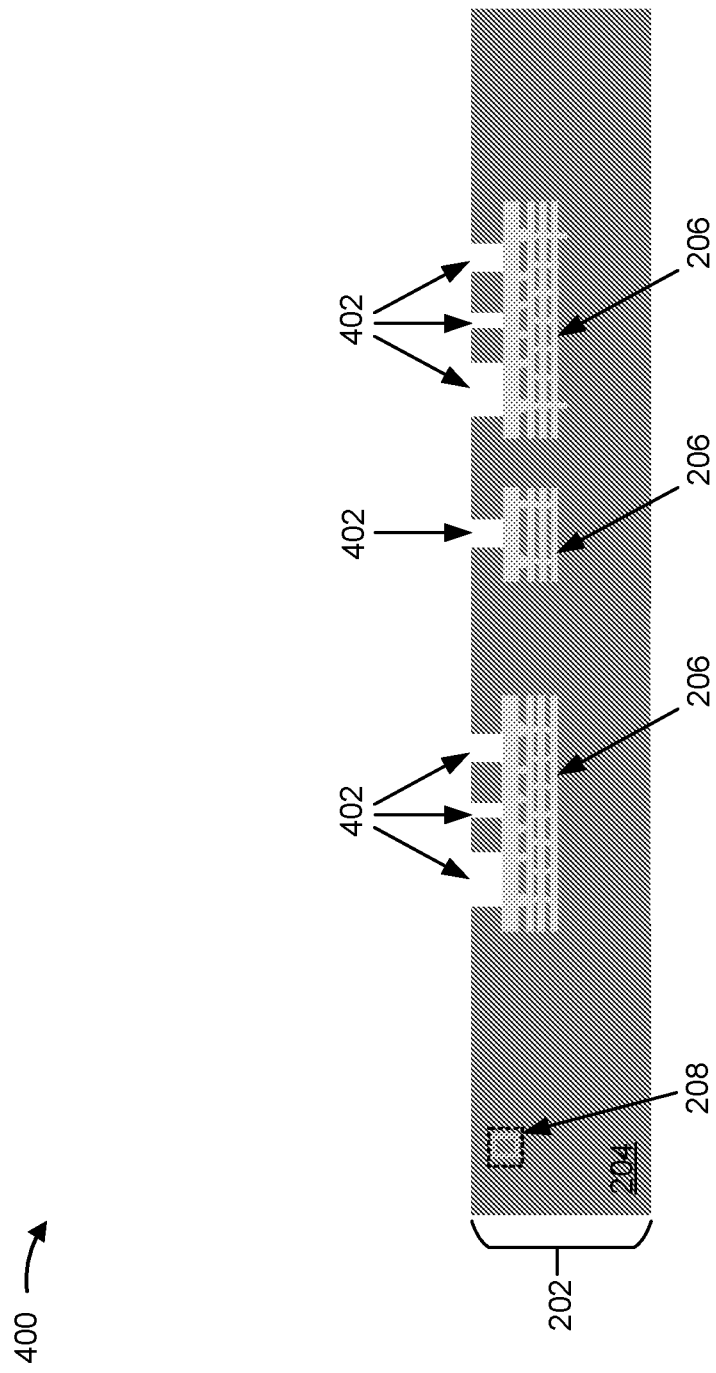

As shown in FIG. 4B, example implementation 400 may include forming a set of recessed portions 402 in a top surface of the body 204 of the first wafer 202. In some implementations, an etching tool (e.g., etching tool 104) may etch one or more portions of the top surface of the body 204 of the first wafer 202 to form the set of recessed portions 402. In some implementations, the etching tool forms the set of recessed portions 402 to extend from the top surface of the body 204 of the first wafer 202 to the one or more metal structures 206.

Figure 4C:
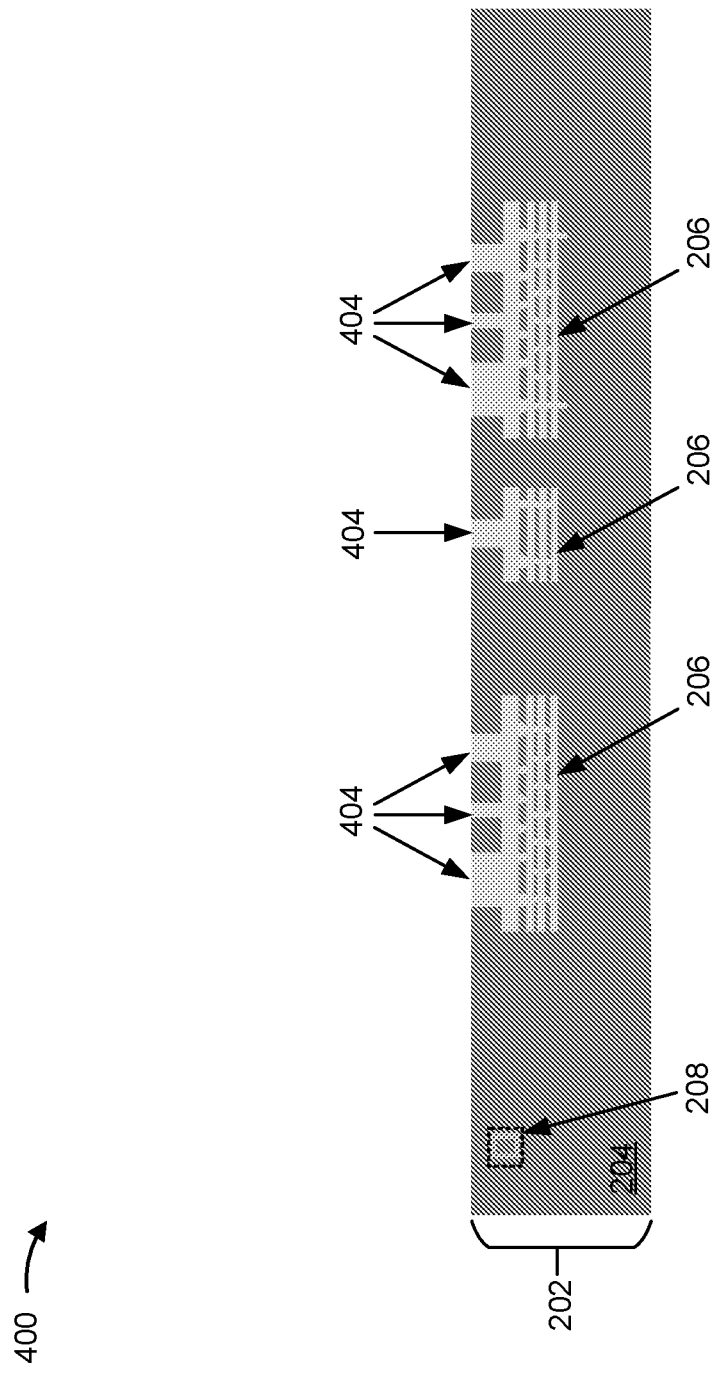

As shown in FIG. 4C, example implementation 400 may include depositing a set of metal elements 404 within the set of recessed portions 402 of first wafer 202. In some implementations, a deposition tool (e.g., deposition tool 102) deposits material of the set of metal elements 404 within the set of recessed portions 402. In some implementations, the deposition tool uses chemical vapor deposition, physical vapor deposition, and/or reflow, among other examples, to deposit the material of the set of metal elements 404 within the set of recessed portions 402 of the first wafer 202. In some implementations, the deposition tool deposits the set of metal elements 404 in multiple layers. For example, the deposition tool may deposit one or more seed layers (e.g., 3 seed layers) in a process for depositing the set of metal elements 404. In some implementations, the deposition tool may deposit one or more barrier layers and/or adhesion layers within the set of recessed portions 402 of the first wafer 202 to reduce electromigration of the set of metal elements 404 into the body 204 and/or to reduce peeling of the set of metal elements 404 from the body 204 and/or from the one or more metal structures 206.

In some implementations, the set of metal elements 404 may be formed of a same material as the set of metal elements 304 (shown in FIG. 3C). For example, the set of metal elements 404 and the set of metal elements 304 may be formed of a copper-based material, a tungsten-based material, or a titanium-based material, among other examples.

Figure 4D:
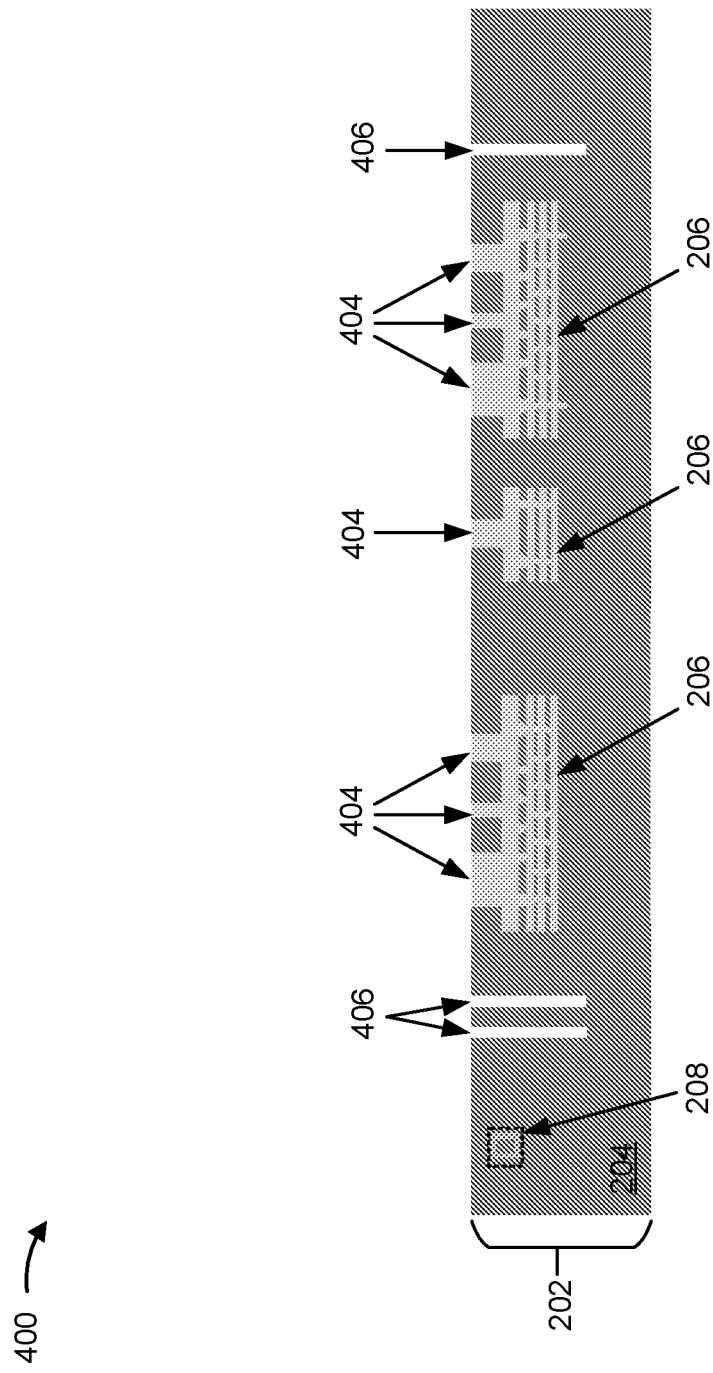

As shown in FIG. 4D, example implementation 400 may include forming a set of trenches 406 in a top surface of the body 204 of the first wafer 202. In some implementations, an etching tool (e.g., etching tool 104) may etch one or more portions of the top surface of the body 204 of the first wafer 202 to form the set of trenches 406. In some implementations, the etching tool forms the set of trenches 406 to extend from the top surface of the body 204 of the first wafer 202 to a depth that extends at least to a depth of a bottom surface of the one or more metal structures 206. In some implementations, the trenches 406 are positioned at locations to match the locations of the trenches 306 formed (or to be formed in the second wafer 210 (e.g., such that openings the trenches 406 and the trenches 306 will at least partially overlap when the first wafer 202 is bonded to the second wafer 210).

As indicated above, FIGS. 4A-4D are provided as an example. Other examples may differ from what is described with regard to FIGS. 4A-4D. In some implementations, example implementation 400 may be a same process as example implementation 300. In some implementations, example implementation 400 may differ from example 300 based on differences between the one or more metal structures 206 and the one or more metal structures 214. Additionally, or alternatively, example implementation 400 may include forming an ASIC on the first wafer 202 and example implementation 300 may include forming an SOC on the second wafer 210, or vice versa.

Figure 5A:
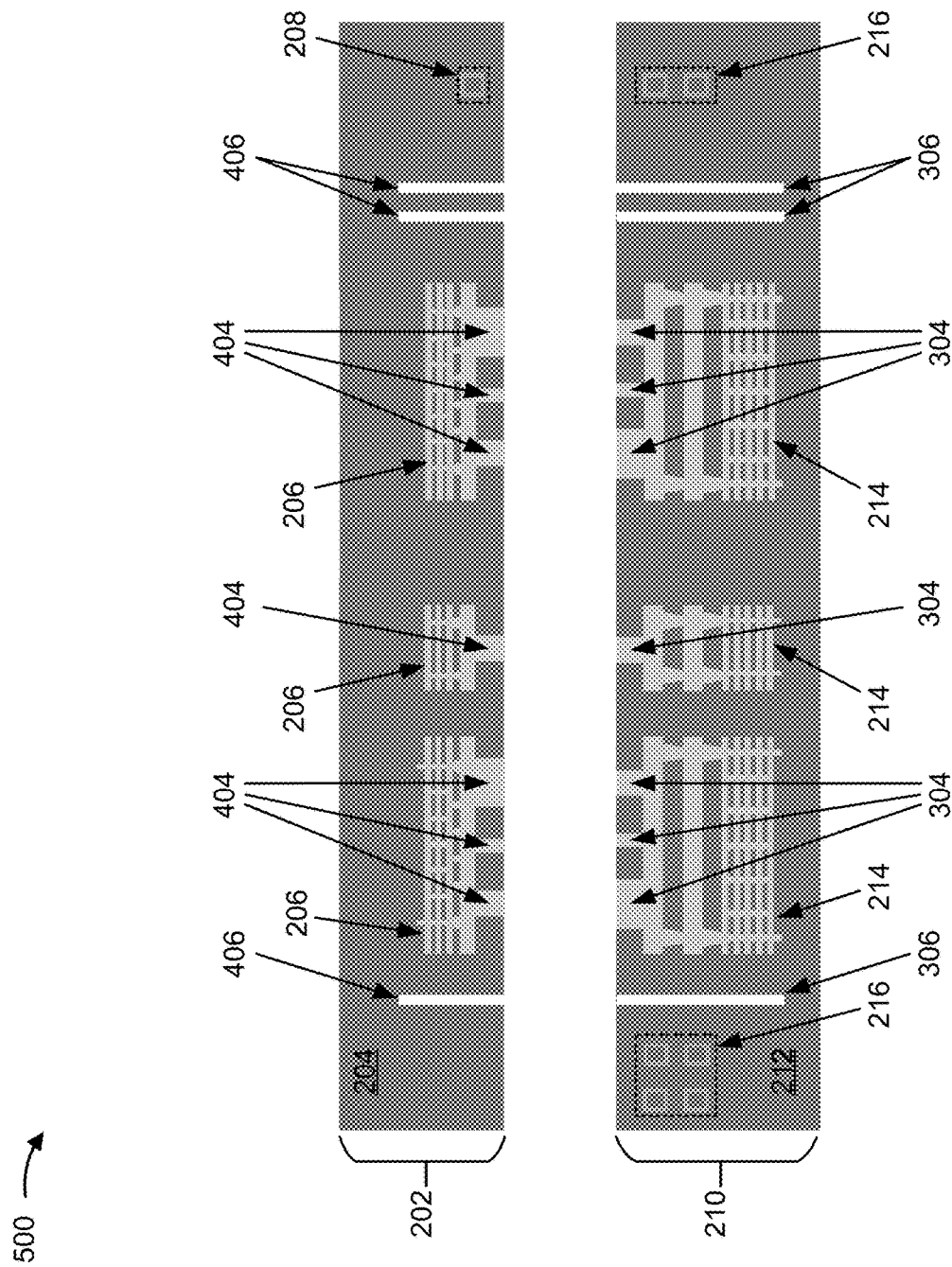
FIGS. 5A-5C are diagrams of an example implementation described herein.
Figure 5B:
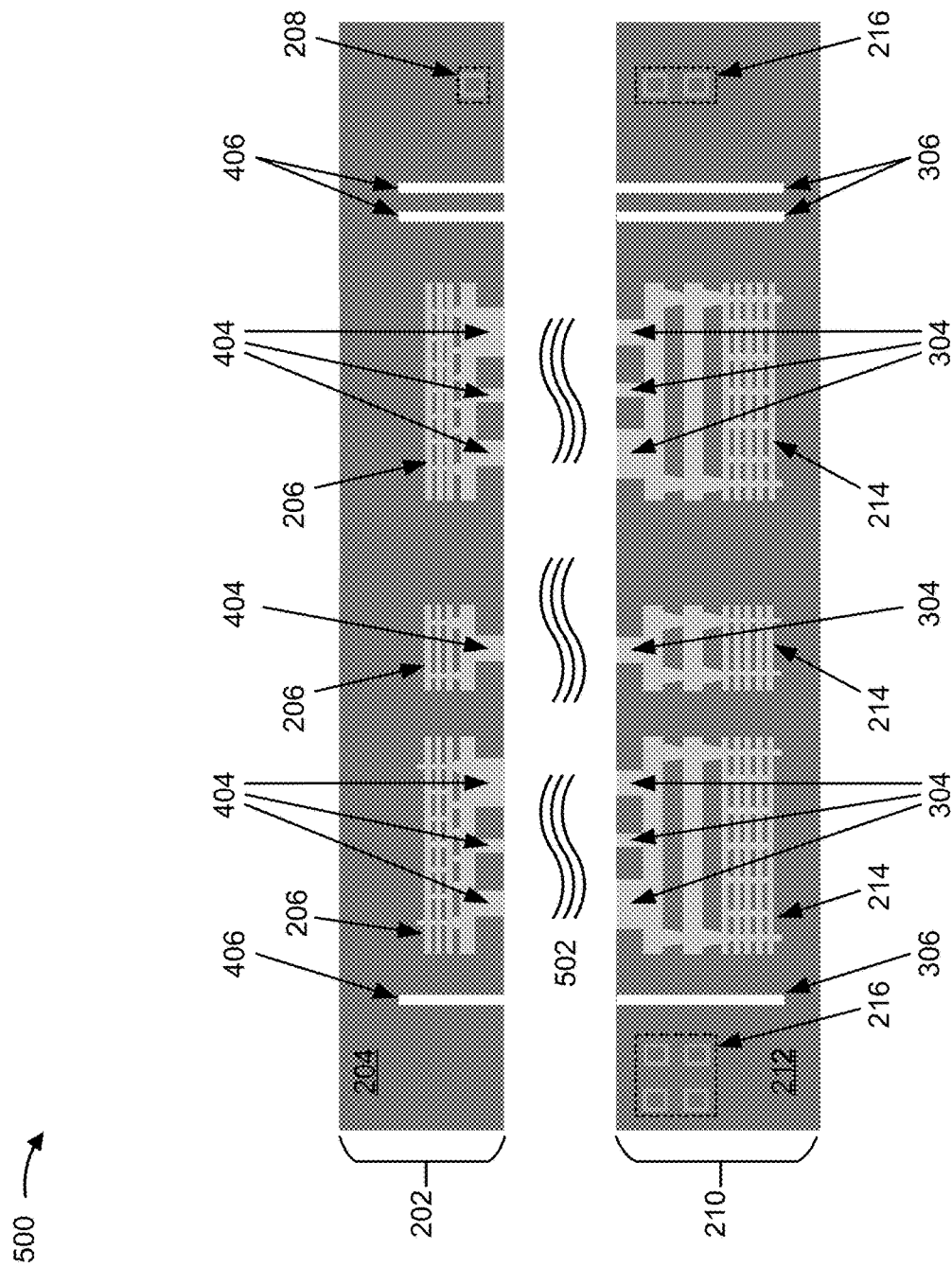
Figure 5C:
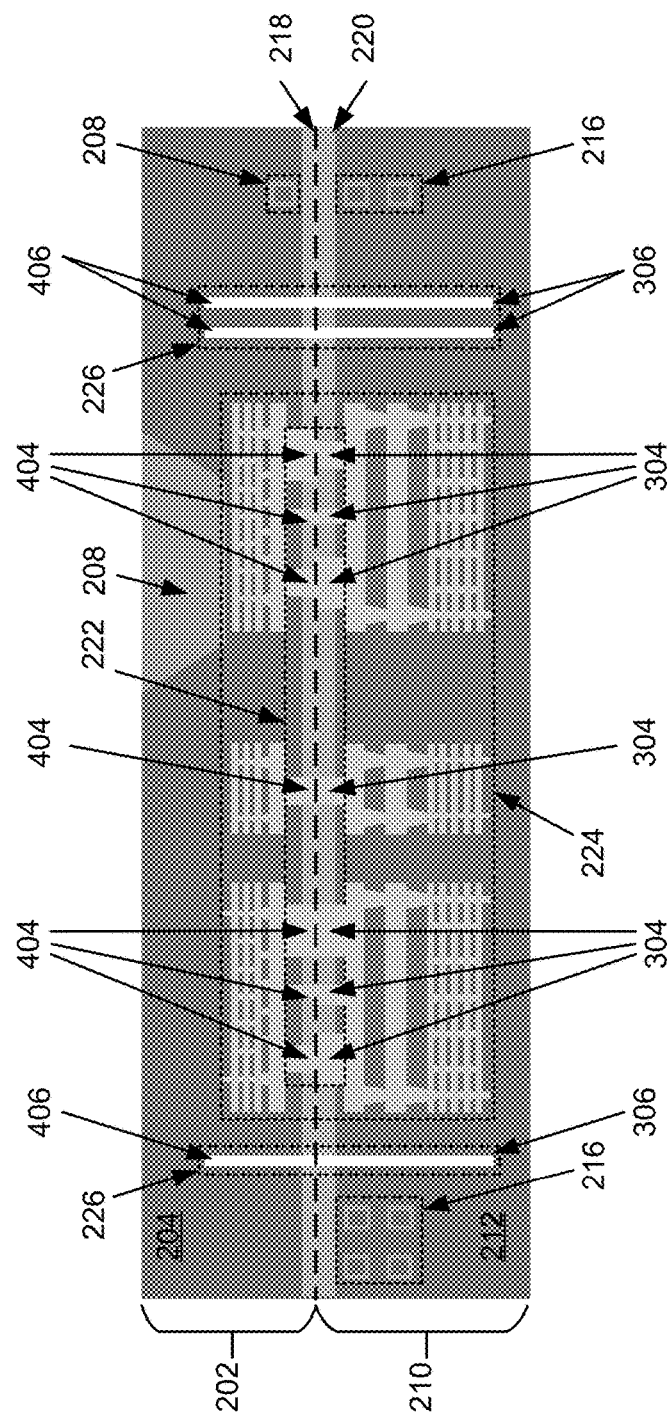

FIGS. 5A-5C are diagrams of an example implementation 500 described herein. Example implementation 500 may be an example process for bonding the first wafer 202 to the second wafer 210 to form the semiconductor device 200. In some implementations, the first wafer 202 and/or the second wafer 210 includes an SOC. Additionally, or alternatively, the first wafer 202 and/or the second wafer 210 includes an ASIC. The first wafer 202 and/or the second wafer 210 may include one or more additional devices, structures, and/or layers not shown in FIGS. 5A-5C.

As shown in FIG. 5A, the first wafer 202 is flipped such that a surface shown as a top surface of the first wafer 202 in FIGS. 3A-3D is now shown as a bottom surface of the first wafer 202 in FIG. 5A. In some implementations, a wafer/die transport tool (e.g., wafer/die transport tool 110) flips the first wafer 202. In some implementations, the wafer/die transport tool positions the set of trenches 406 to be proximate to and/or aligned with the set of trenches 306 (e.g., such that openings of the set of trenches 406 at least partially overlap openings of the set of trenches 306). Alternatively, the wafer/die transport tool may flip the second wafer 210 to position the set of trenches 306 to be proximate to and/or aligned with the set of trenches 406 (e.g., such that openings of the set of trenches 306 at least partially overlap openings of the set of trenches 406).

As shown in FIG. 5B, heat 502 may be applied to the bottom surface of the first wafer 202 and/or to the top surface of the second wafer 210. In some implementations, a bonding tool (e.g., bonding tool 108) applies heat 502 to the bottom surface of the first wafer 202 and/or to the top surface of the second wafer 210. The bonding tool may apply the heat 502 at a temperature within a range of approximately 100 degrees Celsius to approximately 300 degrees Celsius. For example, the temperature may be associated with a melting temperature of the material of the set of metal elements 304 and/or the set of metal elements 404. In this way, a bonding layer (e.g., of oxide-based material) of the first wafer 202 may bond with a bonding layer of the second wafer 210. Additionally, or alternatively, the set of metal elements 304 may form a bond (e.g., a covalent bond) with the set of metal elements 404 with a lower amount of heat 502 than a bond that is formed using only bonding layers of the dielectric materials. This may conserve energy resources associated with manufacturing a semiconductor device (e.g., semiconductor device 200) that includes the first wafer 202 and the second wafer 210).

As shown in FIG. 5C, the first wafer 202 may bond to the second wafer 210 based on the bottom surface of the first wafer 202 contacting the top surface of the second wafer 210. For example, the first wafer 202 may bond to the second wafer 210 based on heat and/or pressure applied to the bottom surface of the first wafer 202 and the top surface of the second wafer 210. In some implementations, a bonding tool (e.g., bonding tool 108) and/or a wafer/die transport tool (e.g., wafer/die transport tool 110) may position the first wafer 202 into contact with the second wafer 210. As shown, the one or more metal structures 206 and the one or more metal structures 214 may be arranged to form the seal ring structure 224.

As further shown in FIG. 5C, the set of trenches 306 and the set of trenches 406 may be arranged to form the trench structure 226. The trench structure 226 includes pairs of trenches 306/406 that extend from at least a (top) surface of the one or more metal structures 206 to at least a (bottom) surface of the one or more metal structures 214 through the interface 218. Based on the trench structure 226 extending through the interface 218 in this manner, stress induced in the bond of the first wafer 202 and the second wafer 210 may be reduced, thereby reducing a likelihood of cracking between the first wafer 202 and the second wafer 210.

As further shown in FIG. 5C, the set of metal elements 304 and the set of metal elements 404 may bond together to form a metal bonding structure 222. The metal bonding structure 222 includes one or more pairs of metal elements 304/404 that extend from the one or more metal structures 206 to the one or more metal structures 214 through the interface 218. Based on the one or more pairs of metal elements 304/404 extending between, and coupling, the one or more metal structure 206 and the one or more metal structures 214, a bond between the first wafer 202 and the second wafer 210 may be improved. For example, the bond may cause a reduced lateral shifting between the first wafer 202 and the second wafer 210, which may reduce a likelihood of cracking between the first wafer 202 and the second wafer 210.

As indicated above, FIGS. 5A-5C are provided as an example. Other examples may differ from what is described with regard to FIGS. 5A-5C.

FIGS. 6A-6J are diagrams of example semiconductor devices 200 described herein. The example semiconductor devices 200 may include alternatives to the trench structure 226 shown in any of FIGS. 2-5C. The described alternatives may be included in the first wafer 202 and/or the second wafer 210 of the semiconductor device 200 and may replace, or may be in addition to, corresponding elements described in connection with FIGS. 2-5C. The alternatives may simplify a manufacturing process by accounting for different shapes and non-aligned trench elements among the first wafer 202 and the second wafer 210.

Figure 6A:
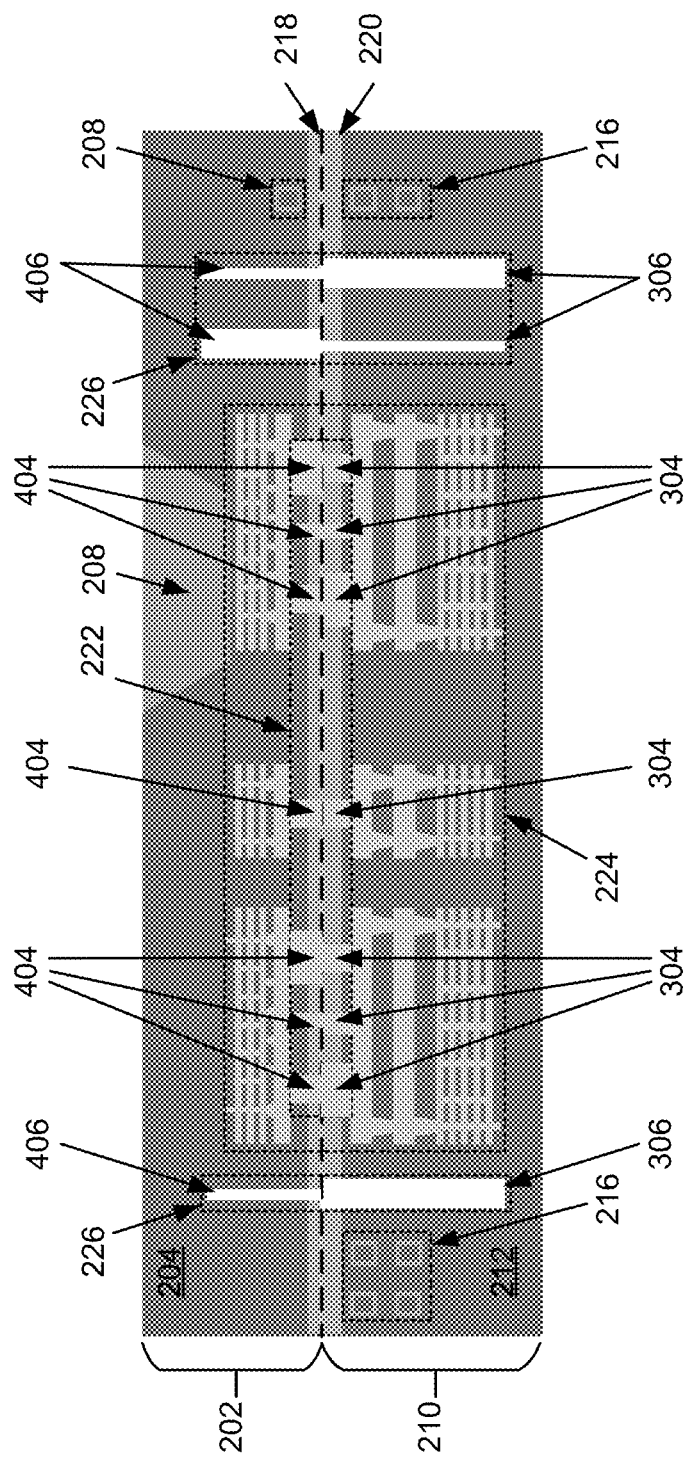
FIGS. 6A-6J are diagrams of example semiconductor structures described herein.

FIG. 6A is an example implementation of the semiconductor device 200 in which widths of trenches in the trench structure 226 vary among the trenches in the trench structure 226. As shown in FIG. 6A, one or more of trenches in the trench structure 226 may have different widths from one or more other trenches in the trench structure 226. Notably, as shown, the trench widths may vary among trenches in the body 204 of the first wafer 202, may vary among trenches in the body 212 of the second wafer 210, or may vary among trenches in both the body 204 of the first wafer 202 and the body 212 of the second wafer 210. In some implementations, as noted above, by the use of differing widths (e.g., such that a first trench of a given trench element is wider than a second trench of the given trench element) enables a process tolerance associated with bonding the first wafer 202 and the second wafer 210 to be more readily satisfied, thereby increasing yield and simplifying manufacture of the semiconductor device 200.

Figure 6B:
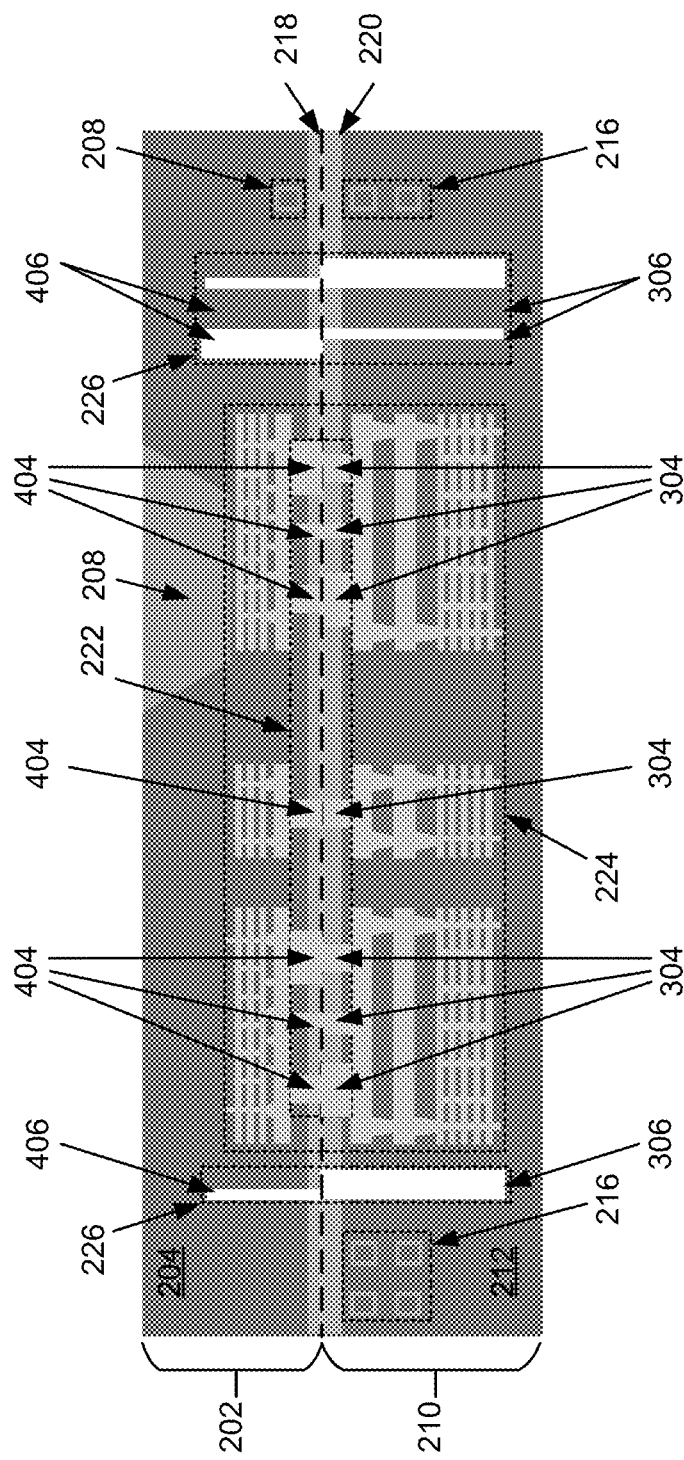

FIG. 6B is an example implementation of the semiconductor device 200 in which a logical central axis of a trench of the trench structure 226 in the body 204 of the first wafer 202 is not aligned with (e.g., is offset from) a logical central axis of a corresponding trench of the trench structure 226 in the body 212 of the second wafer 210. As shown in FIG. 6B, logical central axes of trenches of the trench structure 226 in the body 204 of the first wafer 202 are not aligned with logical central axes of corresponding trenches of the trench structure 226 in the body 212 of the second wafer 210 (i.e., trenches of the trench structure 226 in the body 204 of the first wafer 202 are not centered on corresponding trenches of the trench structure 226 in the body 212 of the second wafer 210). Notably, in this example, openings of the trenches in the body 204 of the first wafer 202 still at least partially overlap the openings of the trenches in the body 212 of the second wafer 210 due, in part the use of trenches with different widths. In some implementations, as noted above, the use of trenches in the body 204 that are not centered on trenches in the body 212 enables a process tolerance associated with bonding the first wafer 202 and the second wafer 210 to be more readily satisfied, thereby increasing yield and simplifying manufacture of the semiconductor device 200.

Figure 6C:
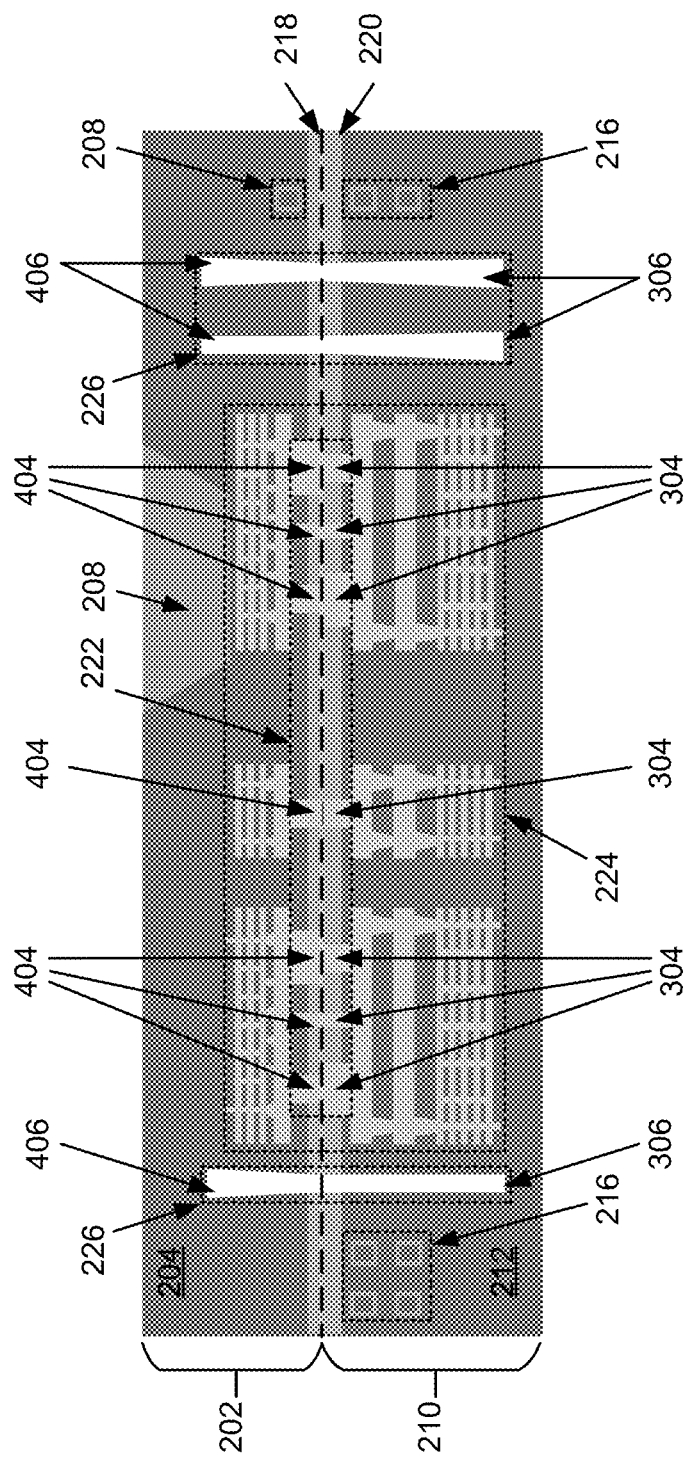
Figure 6D:
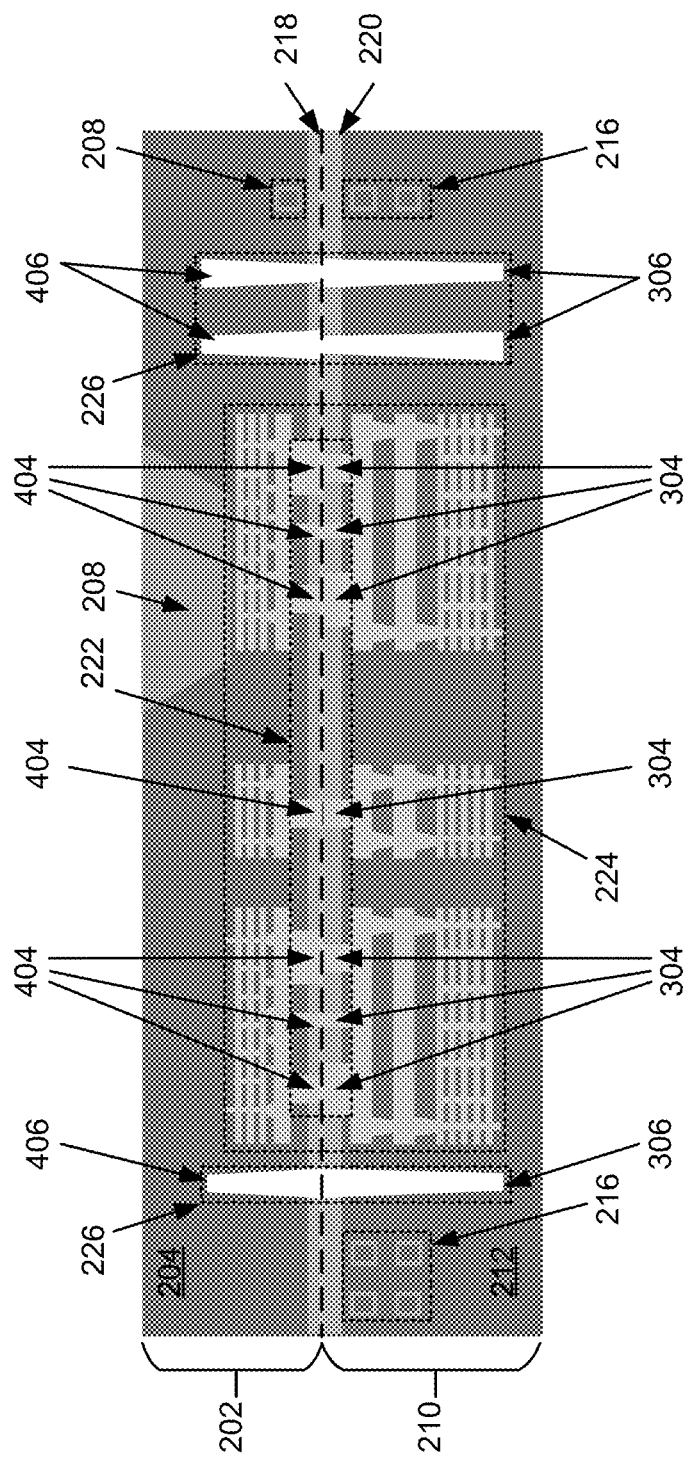

FIGS. 6C and 6D are example implementations of the semiconductor device 200 in which side-surface configurations and trench shapes of trenches in the trench structure 226 vary among the trenches in the trench structure 226. As shown in FIGS. 6C and 6D, one or more of the trenches in the trench structure 226 may have sloped side-surfaces and one or more trenches may have non-sloped sides-surfaces (e.g., such that trench shapes vary among the trenches). Notably, as shown, the side-surface configurations and trench shapes may vary among trenches in the body 204 of the first wafer 202, may vary among trenches in the body 212 of the second wafer 210, or may vary among trenches in both the body 204 of the first wafer 202 and the body 212 of the second wafer 210. As noted above, the use of different side-surface configurations or trench shapes in the trench structure 226 allows for different etch recipes or different etch processes to be used to form the trenches of the trench structure 226, which can simplify formation of the trench structure 226 (e.g., by enabling one or more trenches of the trench structure 226 to be formed concurrently with formation other trenches on the wafer and/or enabling different trenches of the trench structure 226 to be formed at different times, using different processes, using different etch recipes, or the like).

Figure 6E:
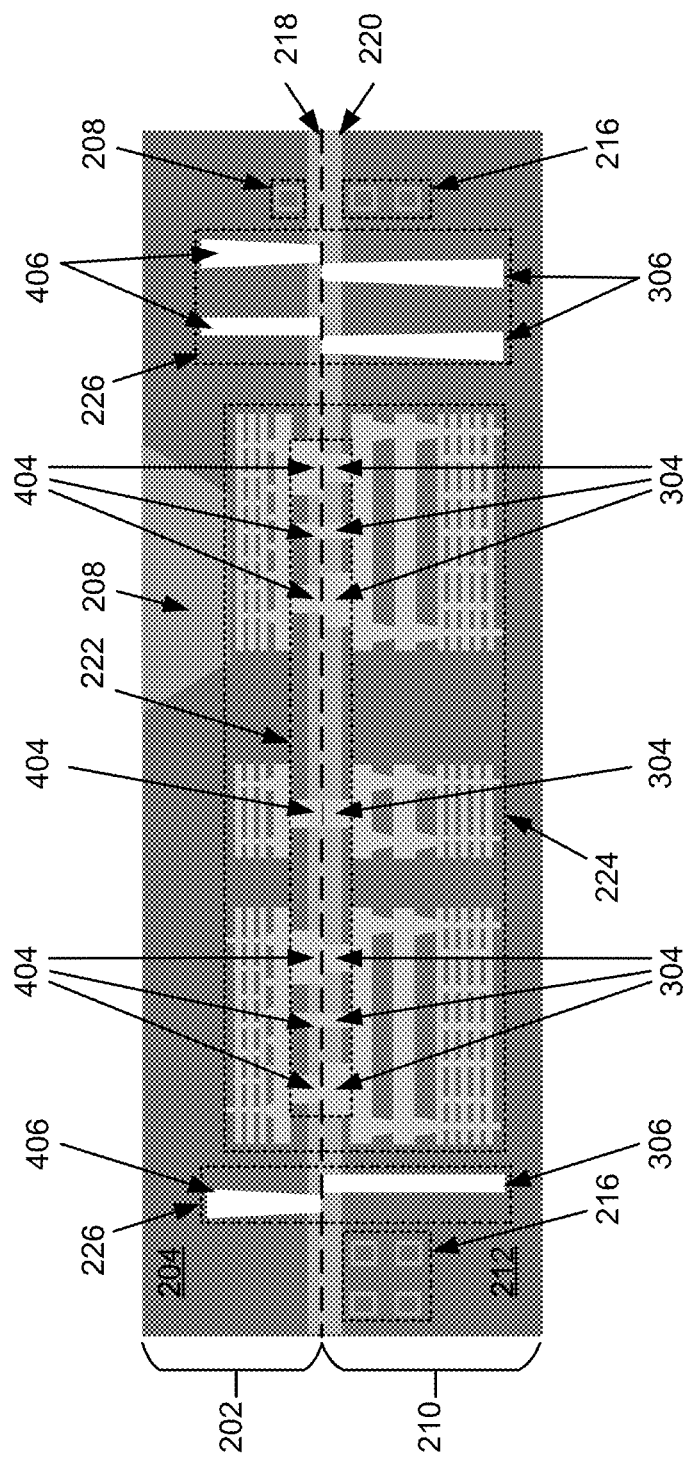
Figure 6F:
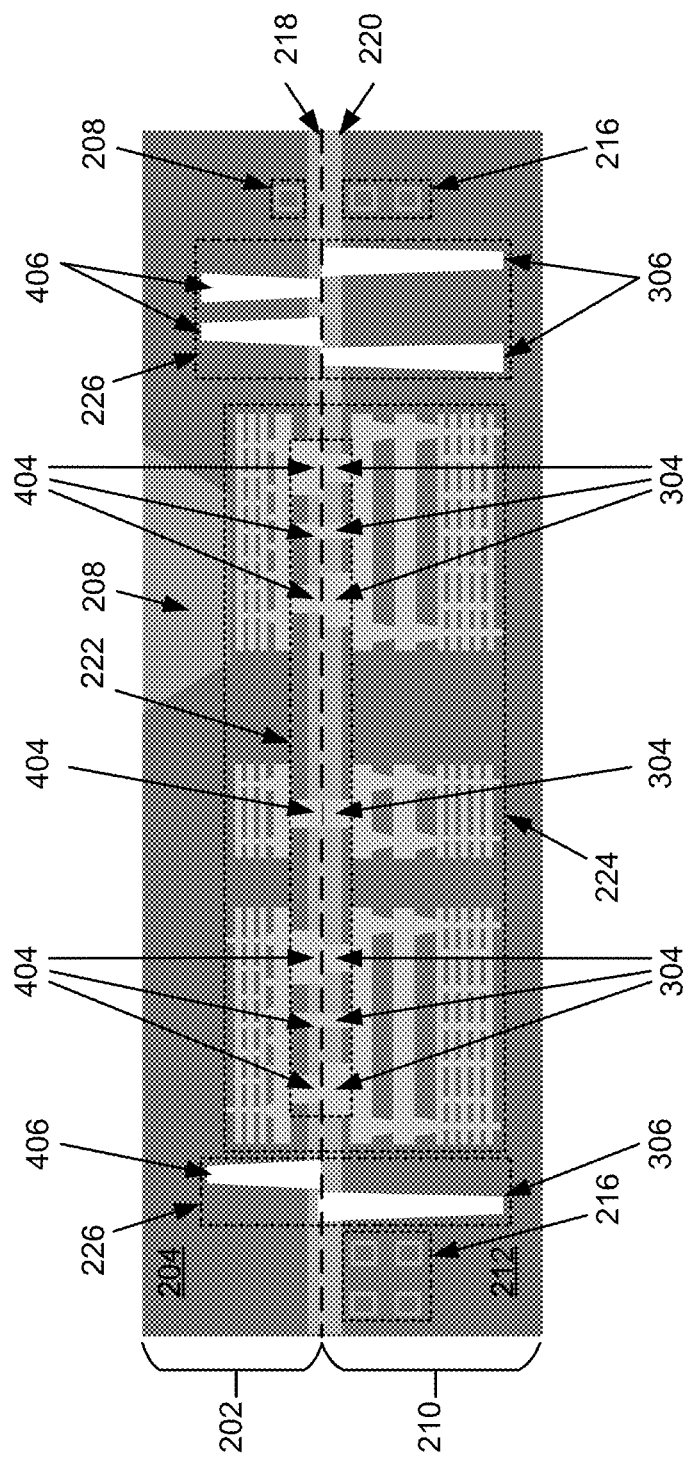

FIGS. 6E and 6F are example implementations of the semiconductor device 200 in which openings of trenches of the trench structure 226 within the body 204 of the first wafer 202 do not overlap with openings of trenches of the trench structure 226 within the body 212 of the second wafer 210. In some implementations, such a configuration can reduce a likelihood of wafer cracking (e.g., as compared to a semiconductor device without the trench structure 226). In some implementations, the use of trenches in the body 204 that do not overlap trenches in the body 212 enables a process tolerance associated with bonding the first wafer 202 and the second wafer 210 to be more readily satisfied, thereby increasing yield and simplifying manufacture of the semiconductor device 200.

Figure 6G:
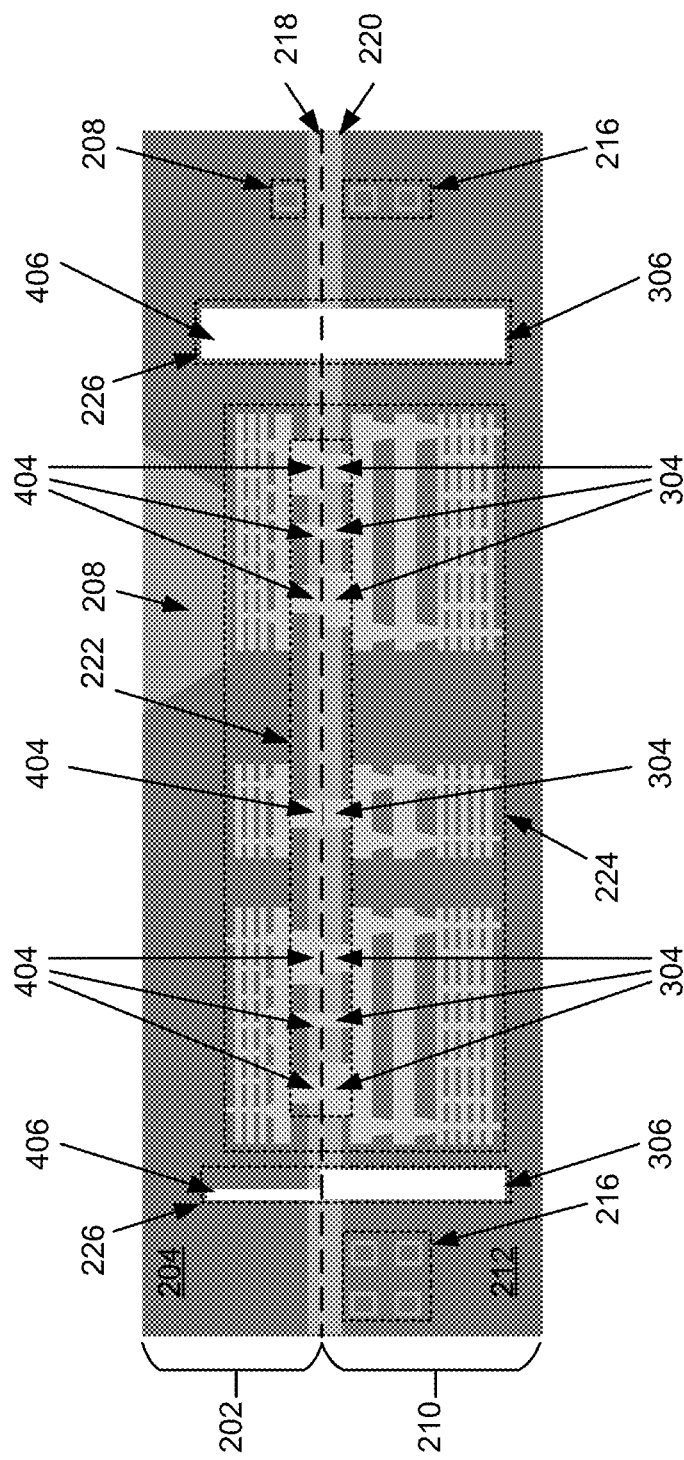

FIG. 6G is example implementation of the semiconductor device 200 in which the trench structure 226 includes a single, wider trench element on one side of the seal ring structure 224 (e.g., rather than multiple comparatively thinner trench elements as shown in the implementation of FIG. 2). In some implementations, a single, wider trench element on a given side of the seal ring structure 224 improves stress reduction provided by the trench element, while simplifying formation of the trench structure 226.

Figure 6H:
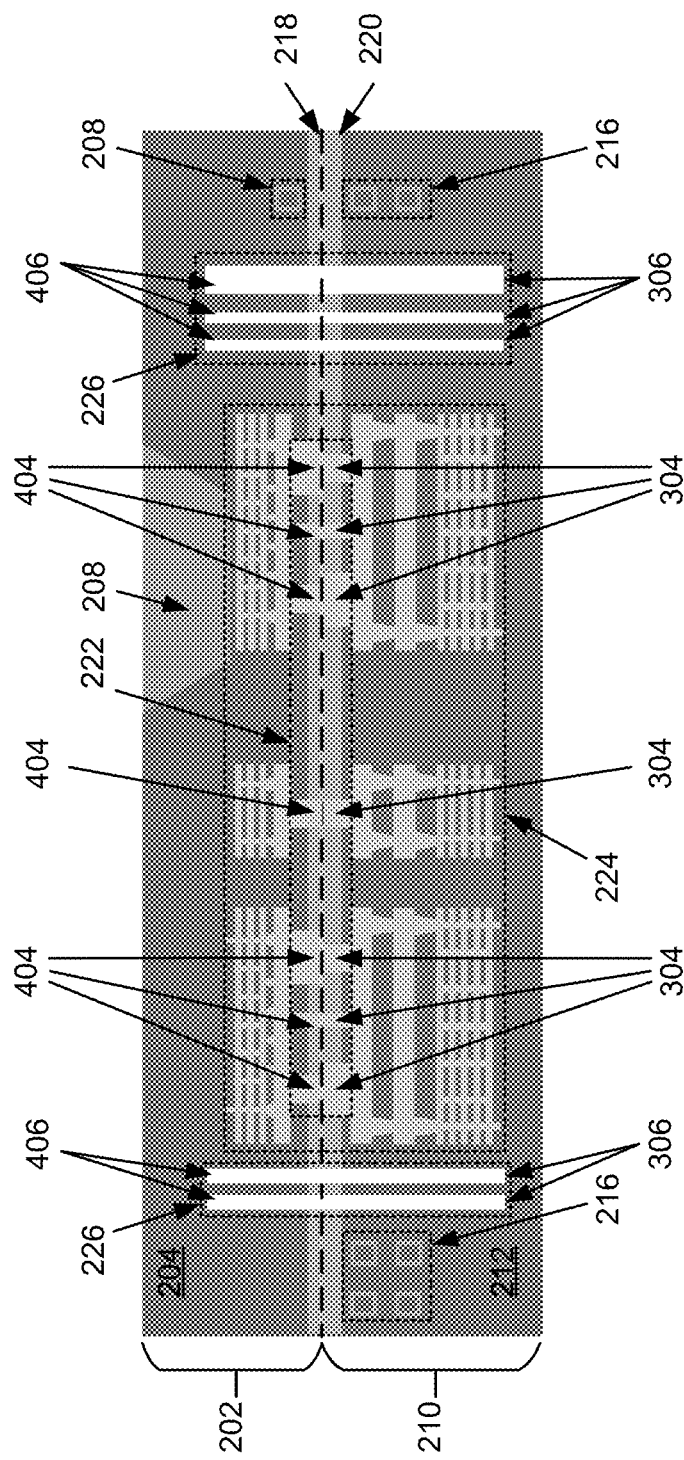

FIG. 6H is example implementation of the semiconductor device 200 in which the trench structure 226 includes a higher quantity of trench elements on the sides of the seal ring structure 224 (e.g., as compared to the implementation shown in FIG. 2). In some implementations, as noted above, including a higher quantity of trench elements on a given side of the seal ring structure 224 improves stress reduction provided by the trench elements on the given side of the seal ring structure 224. Thus, in some implementations, the trench structure 226 may include multiple trench elements on one or more sides of the seal ring structure 224 in order to improve stress reduction or protection provided by the trench structure 226.

Figure 6I:
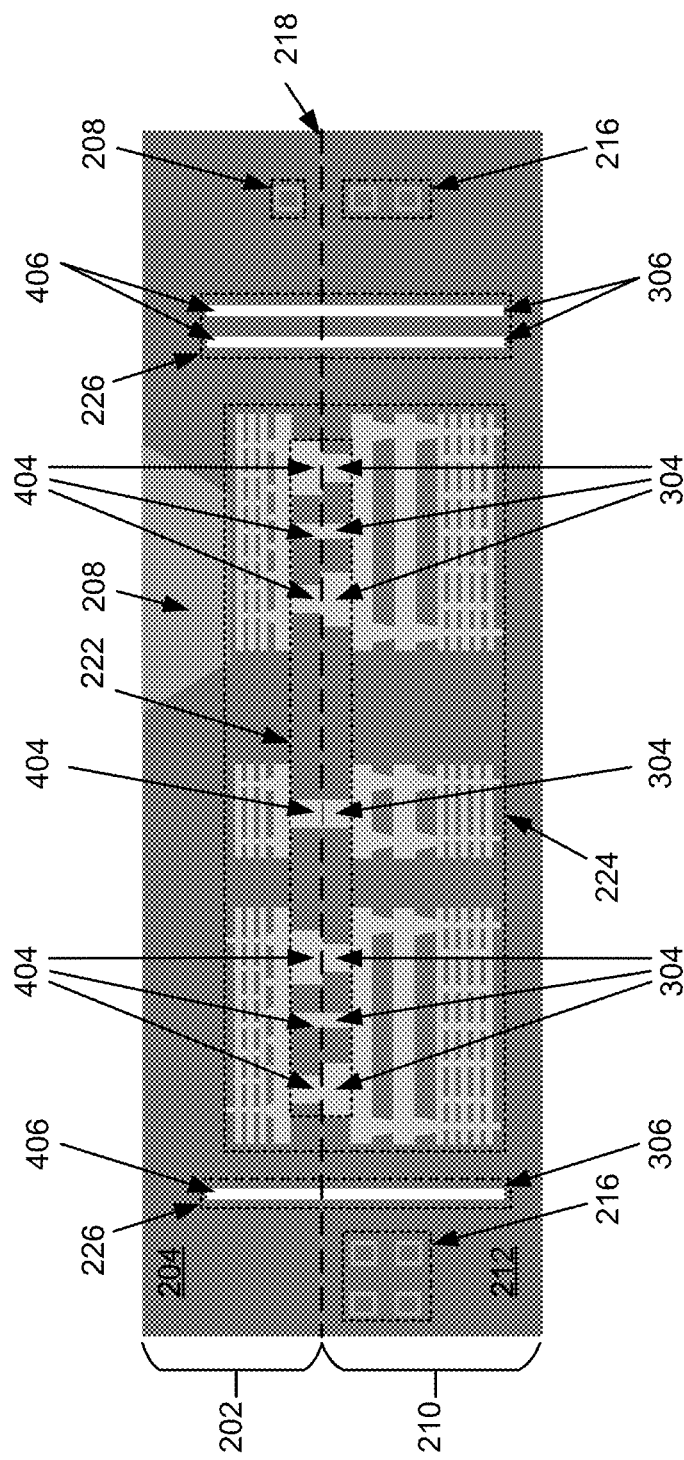
Figure 6J:
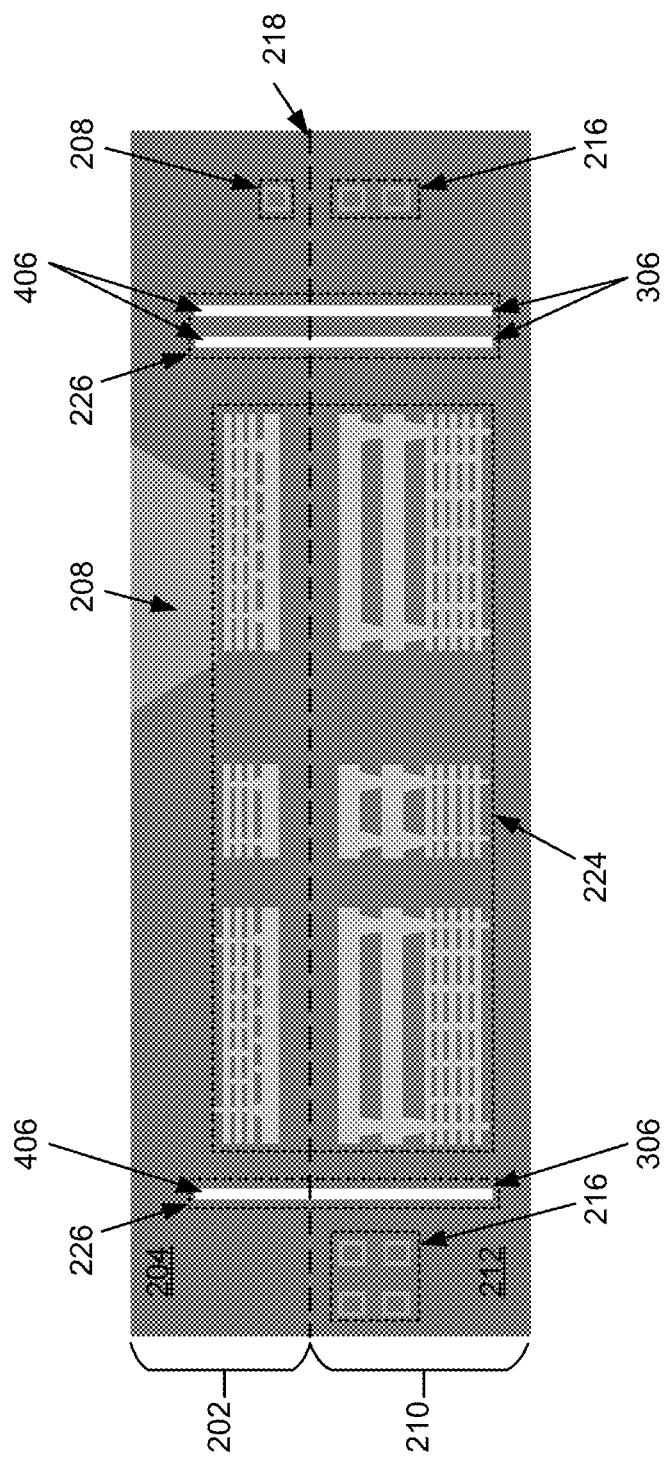

FIGS. 6I and 6J are example implementations of the semiconductor device 200 in which the first wafer 202 and the second wafer 210 are metal bonded via the metal bonding structure 222 (e.g., dielectric layers of the first wafer 202 and the second wafer 210 are not bonded at the interface 218). In the example shown in FIG. 6J, dielectric layers of the first wafer 202 and the second wafer 210 are bonded at the interface 218, and the semiconductor device 200 does not include the metal bonding structure 222 (e.g., such that the metal structures 206 and the metal structures 214 are not connected through the interface 218). In these examples, the use of a simplified or lower-complexity bonding process may reduce cost and complexity associated with fabricating the semiconductor device 200, while the trench structure 226 still provides improved stress reduction or protection as described herein.

As indicated above, FIGS. 6A-6J are provided as examples. Other examples may differ from what is described with regard to FIGS. 6A-6J.

FIGS. 7A-7I are diagrams of example semiconductor devices 200 described herein. The example semiconductor devices 200 may include alternatives to the set of metal elements 304, the set of metal elements 404, and/or the metal bonding structure 222 shown in any of FIGS. 2-6J. The described alternatives may be included in the first wafer 202 and/or the second wafer 210 and may replace, or may be in addition to, corresponding elements described in connection with FIGS. 2-6J. The example semiconductor devices 200 shown in FIGS. 7A-7I may include a hybrid bonding region 220 in which the set of metal elements 304 and the set of metal elements 404 bond to form the metal bonding structure 222, and in which dielectric materials of the body 204 bond with dielectric materials of the body 212. The alternatives may simplify a manufacturing process by accounting for different shapes and non-aligned metal elements to bond the first wafer 202 to the second wafer 210.

Figure 7A:
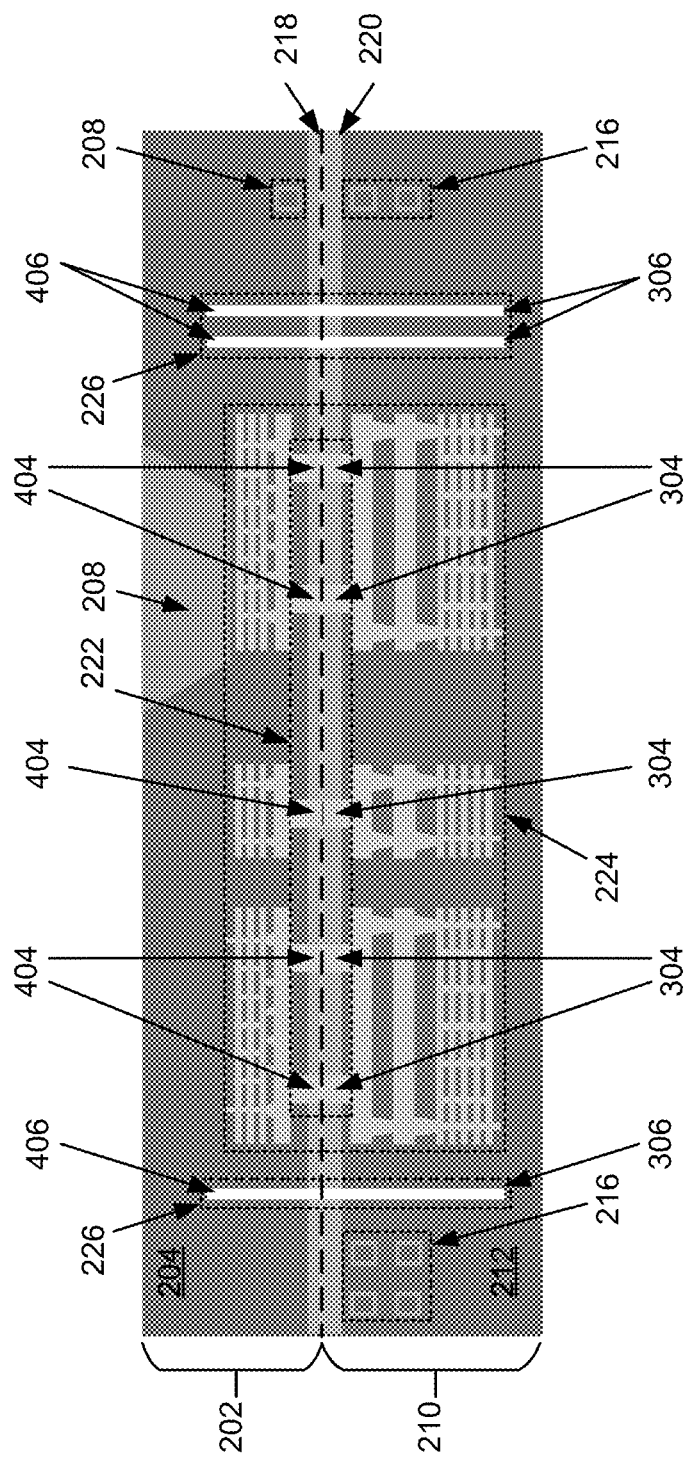
FIGS. 7A-7I are diagrams of example semiconductor structures described herein.

As shown in FIG. 7A, one or more of the set of metal elements 304 or the set of metal elements 404 of the metal bonding structure 222 may have a different quantity of metal elements than shown in the example implementation of the semiconductor device shown in FIG. 2. For example, a set of metal elements 304 and a set of metal elements 404 between leftmost portions of the seal ring structure 224 may include two metal elements metal structures (rather than three metal elements, as shown in FIG. 2). Similarly, a set of metal elements 304 and a set of metal elements 404 between rightmost portions of the seal ring structure 224 may include two metal elements metal structures (rather than three metal elements, as shown in FIG. 2).

Figure 7B:
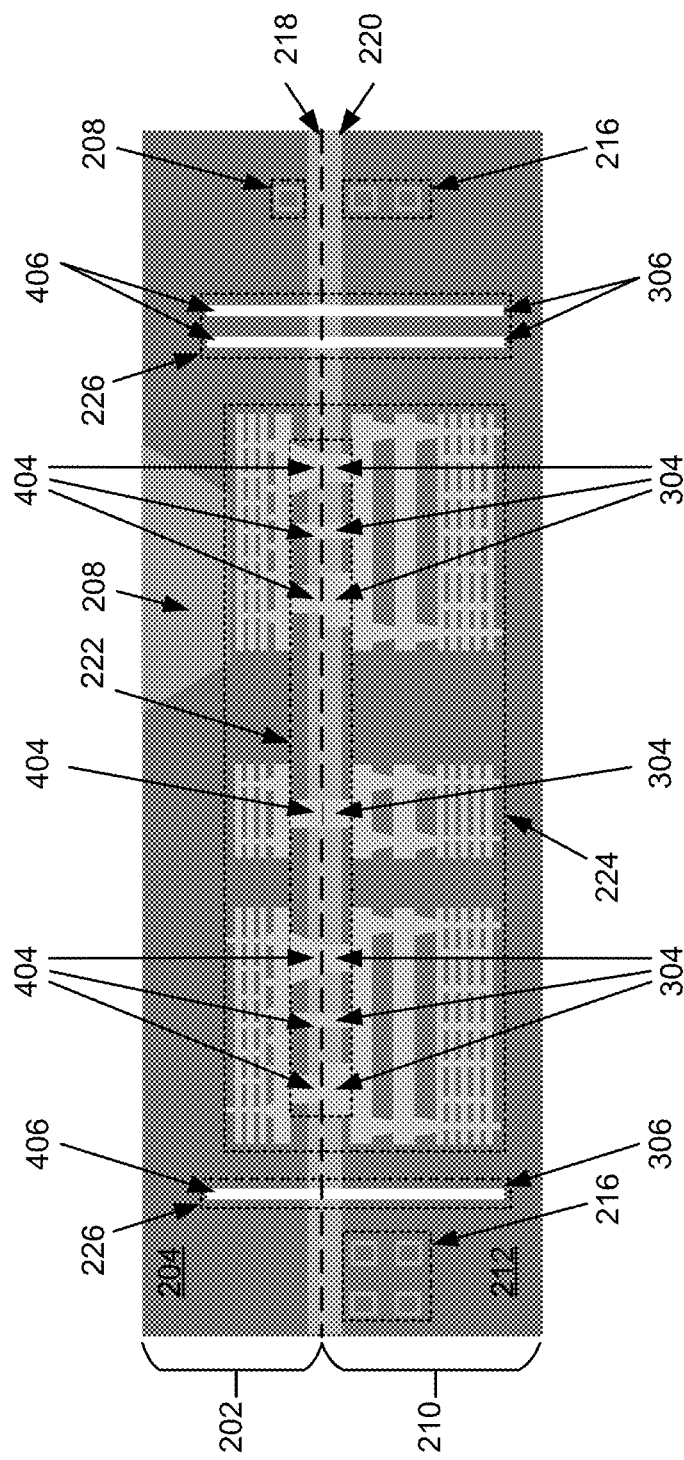
Figure 7C:
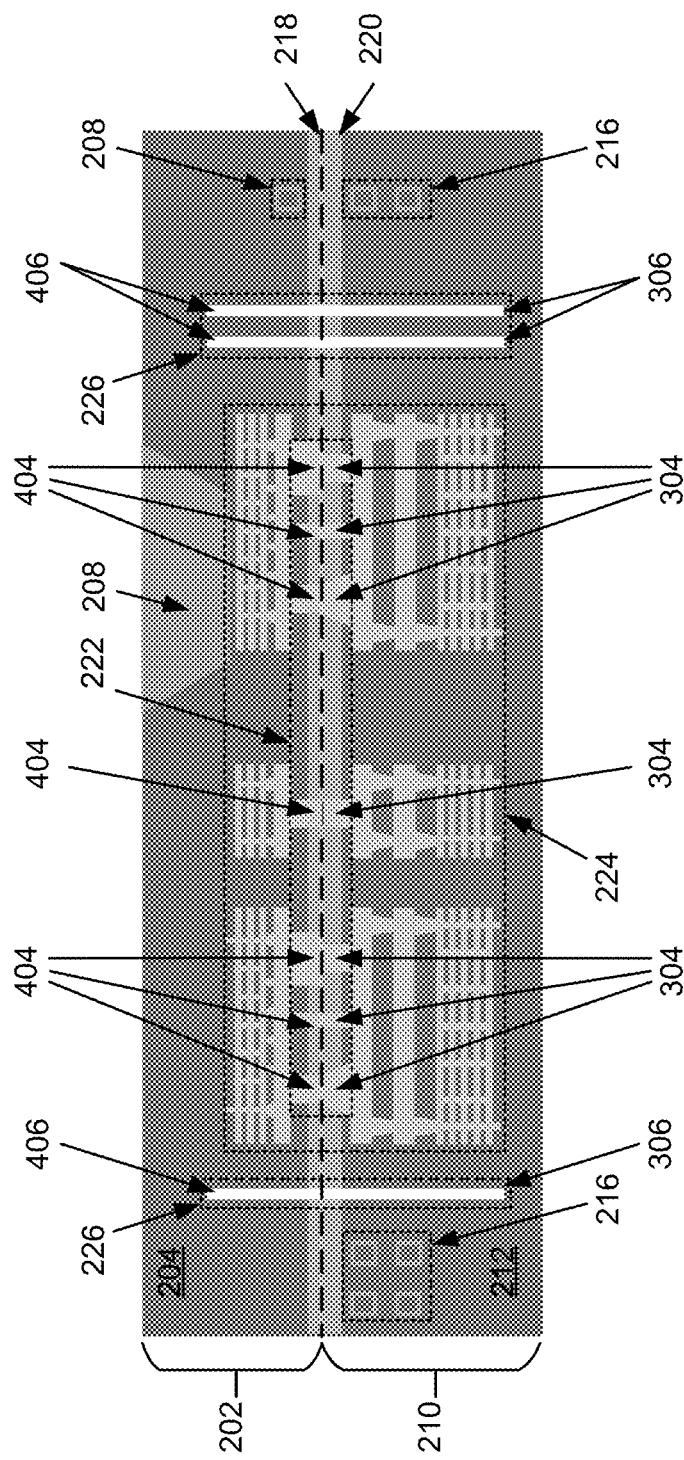

As shown in FIGS. 7B and 7C, one or more of the set of metal elements 404 and/or one or more of the set of metal elements 304 may have a sloped side-surface. For example, the one or more of the set of metal elements 404 and/or the one or more of the set of metal elements 304 may have a trapezoidal-shaped cross-section. As also shown in FIGS. 7B and 7C, one or more of the set of metal elements 404 may have different shapes from one or more others of the set of metal elements 404. Similarly, one or more of the set of metal elements 304 may have different shapes from one or more others of the set of metal elements 304. As also shown in FIGS. 7B and 7C, the set of metal elements 404 may have metal elements having different shapes and/or different widths from one or more others of the set of metal elements 404. Similarly, the set of metal elements 304 may have metal elements having different shapes and/or different widths from one or more others of the set of metal elements 304.

Figure 7D:
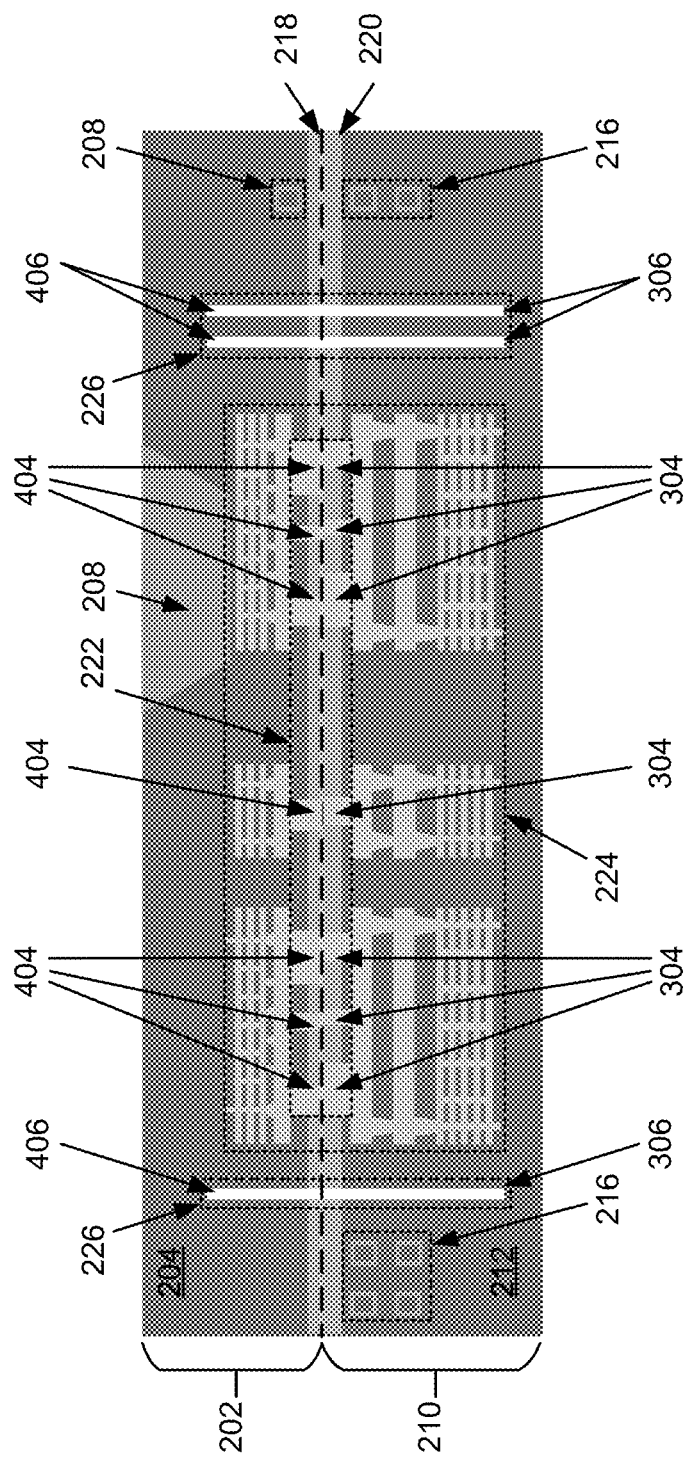
Figure 7E:
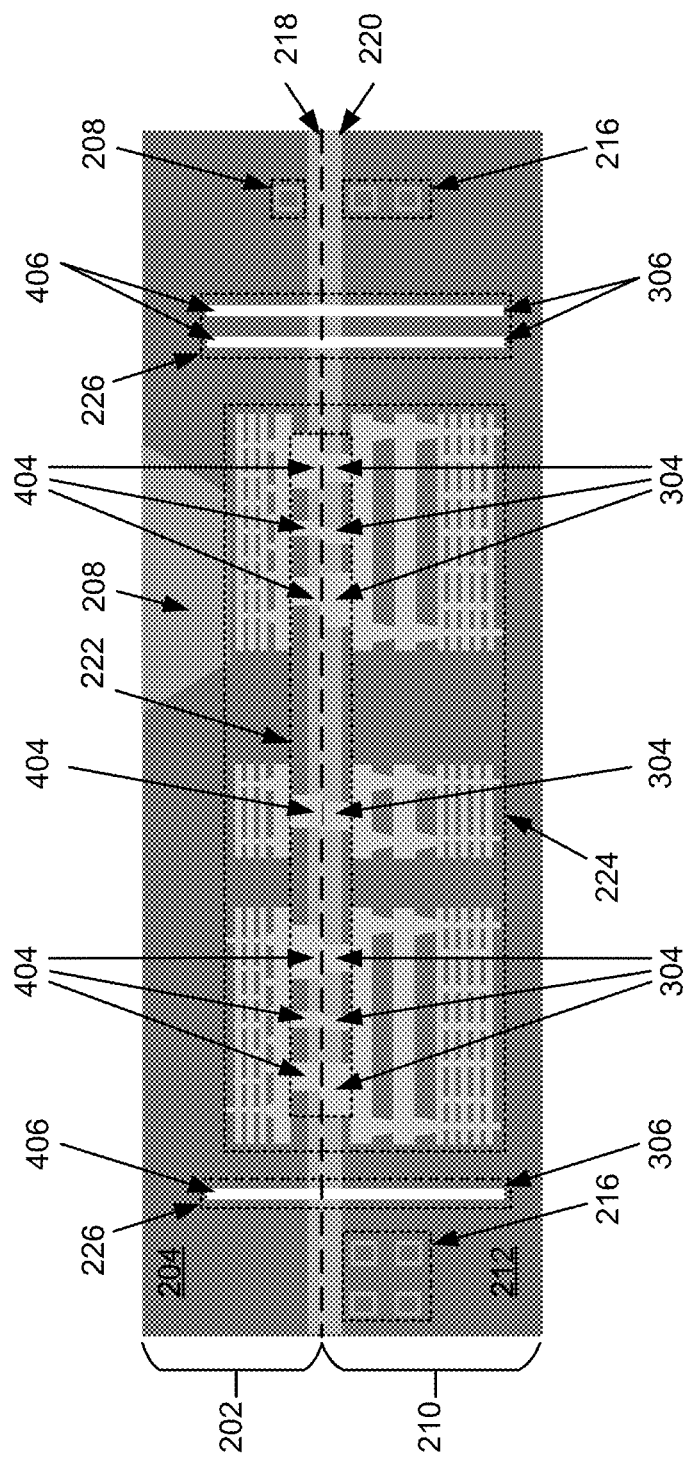

As shown in FIGS. 7D and 7E, pairs of bonded elements of the set of metal elements 304 and the set of metal elements 404 may not be aligned along a same logical axis (e.g., a logical axis that is orthogonal to the interface 218). For example, a first metal element 404, of the set of metal elements 404, may be bonded to a second metal element 304 of the set of metal elements 304, with the first metal element 404 extending along, and being centered on, a first logical axis from the first metal structure 206 to the interface 218. The second metal element 304 may extend along, and be centered on, a second logical axis from the second metal structure 214 to the interface 218, where the first logical axis is laterally displaced from the second logical axis. As shown in FIG. 7D, the set of metal elements 404 may extend along, and may be centered on, a first set of logical axes and the set of metal elements 304 may extend along, and may be centered on, a second set of logical axes that are laterally displaced from the first set of logical axes with a shift to the left side of FIG. 7D. Alternatively, as shown in FIG. 7E, the set of metal elements 404 may extend along, and may be centered on, a first set of logical axes and the set of metal elements 304 may extend along, and may be centered on, a second set of logical axes that are laterally displaced from the first set of logical axes with a shift to the right side of FIG. 7E.

Figure 7F:
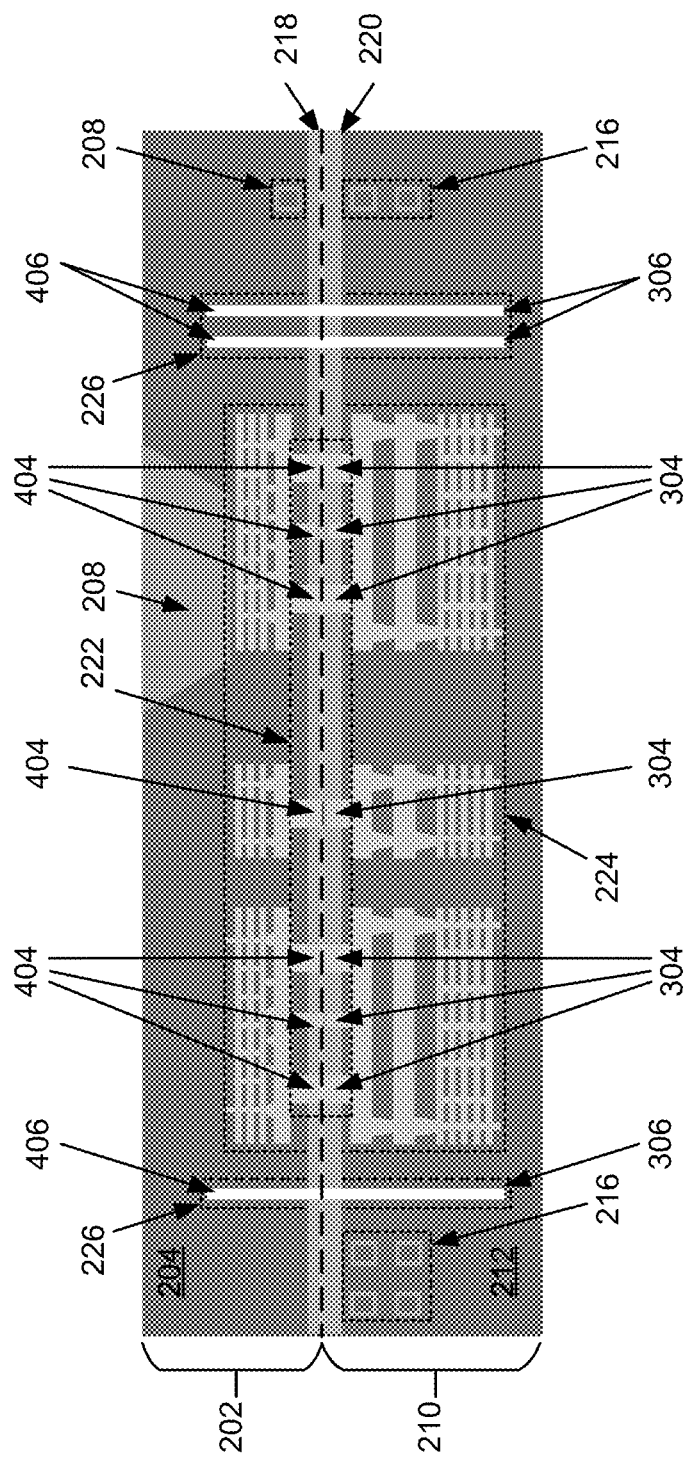
Figure 7G:
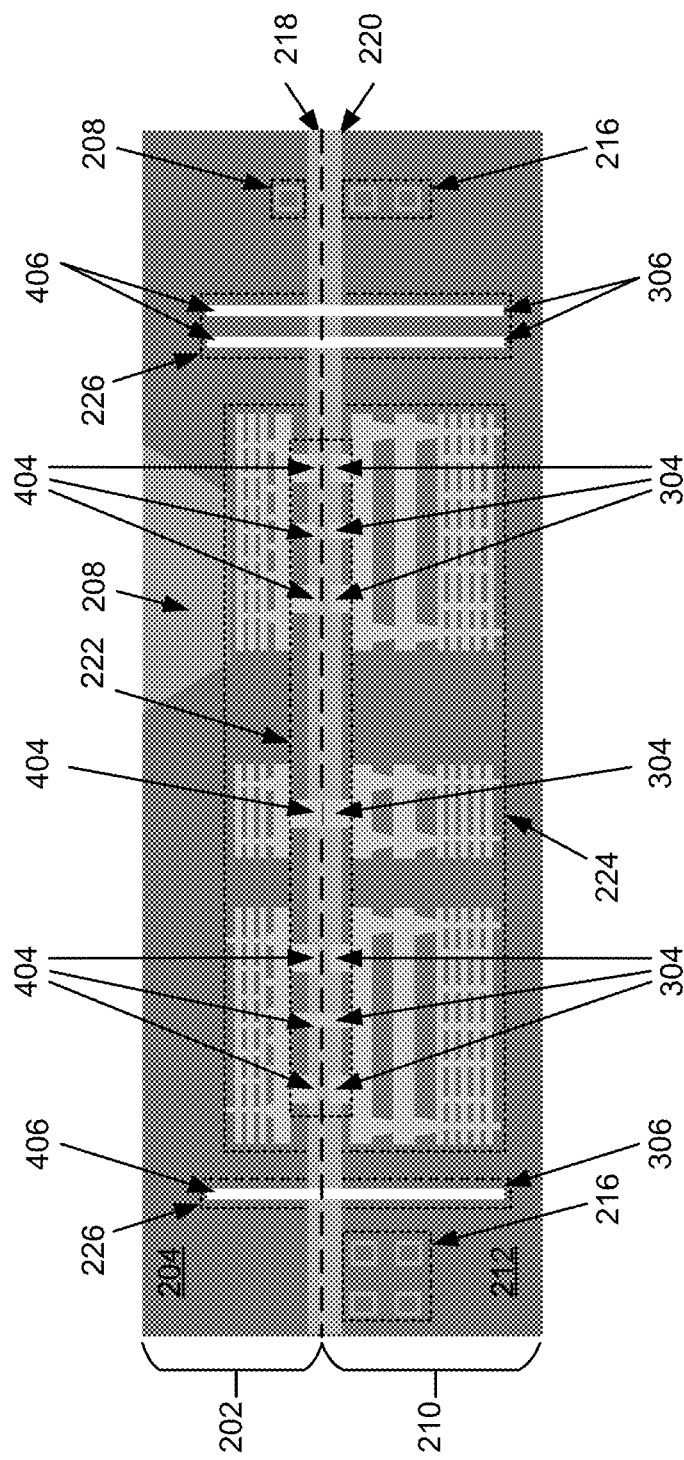

As shown in FIGS. 7F and 7G, a first subset of the set of metal elements 304 may bond to a first subset of the set of metal elements 404 and a second subset of the set of metal elements 304 may be separated (e.g., not bonded) from a second subset of the set of metal elements 404. For example, the set of metal elements 404 may include at least one metal element 404 that is not bonded to any metal element of the set of metal elements 304.

As shown in FIG. 7F, the at least one metal element 404 that is not bonded to any metal element of the set of metal elements 304 may include non-consecutive metal elements 404. In other words, a first element of the at least one metal element 404 may be separated from a second element of the at least one metal element 404 by a metal element of the set of metal elements 404 that is bonded to a metal element 304 of the set of metal elements. In this way, even if the metal bonding structure 222 includes at least one of metal element 404 that is not bonded to any metal element of the set of metal elements 304, the metal bonding structure 222 may provide structural support across the interface 218 without localized weaknesses.

As shown in FIG. 7G, each of the one or more metal structures 206 and the one or more metal structures 214 may be connected via at least one bonded pair of the set of metal elements 304 and the set of metal elements 404. In this way, each of the one or more metal structures 206 and the one or more metal structures 214 may provide structural support to the bond between the first wafer 202 and the second wafer 210.

Figure 7H:
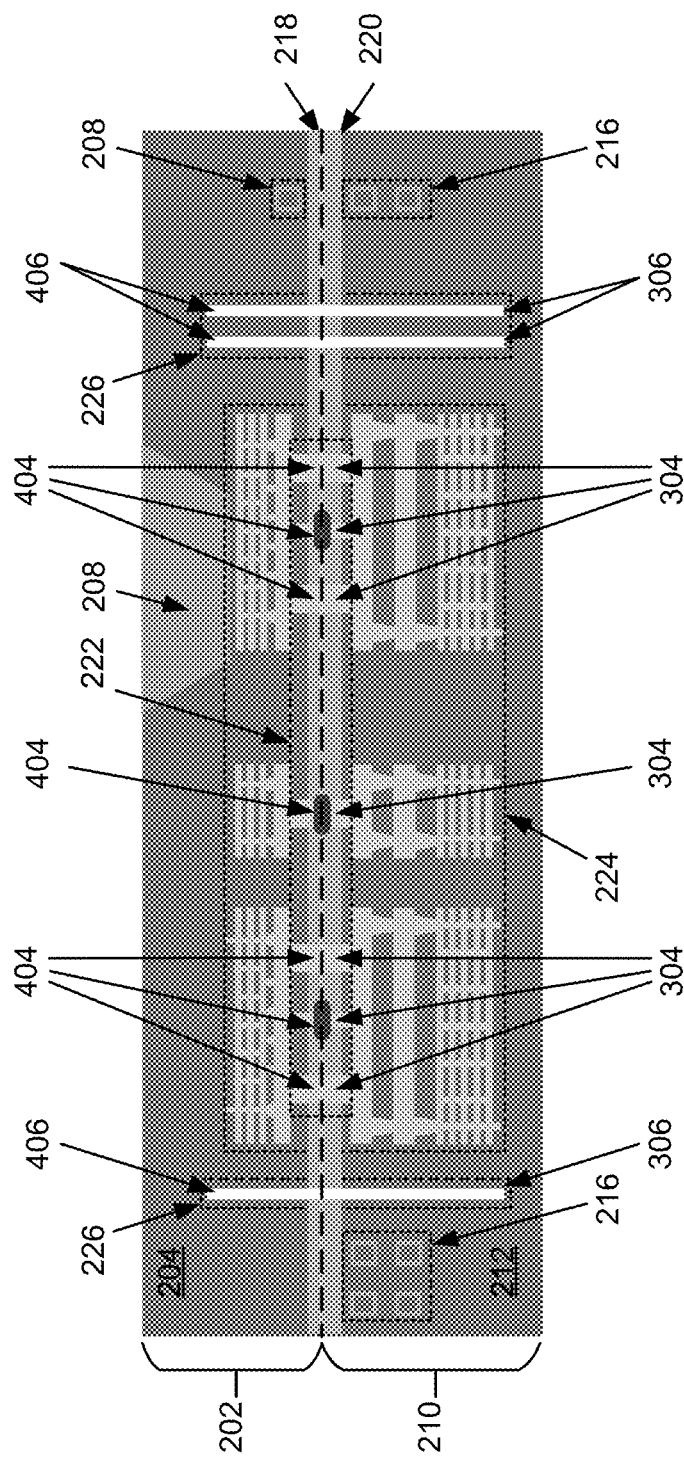
Figure 7I:
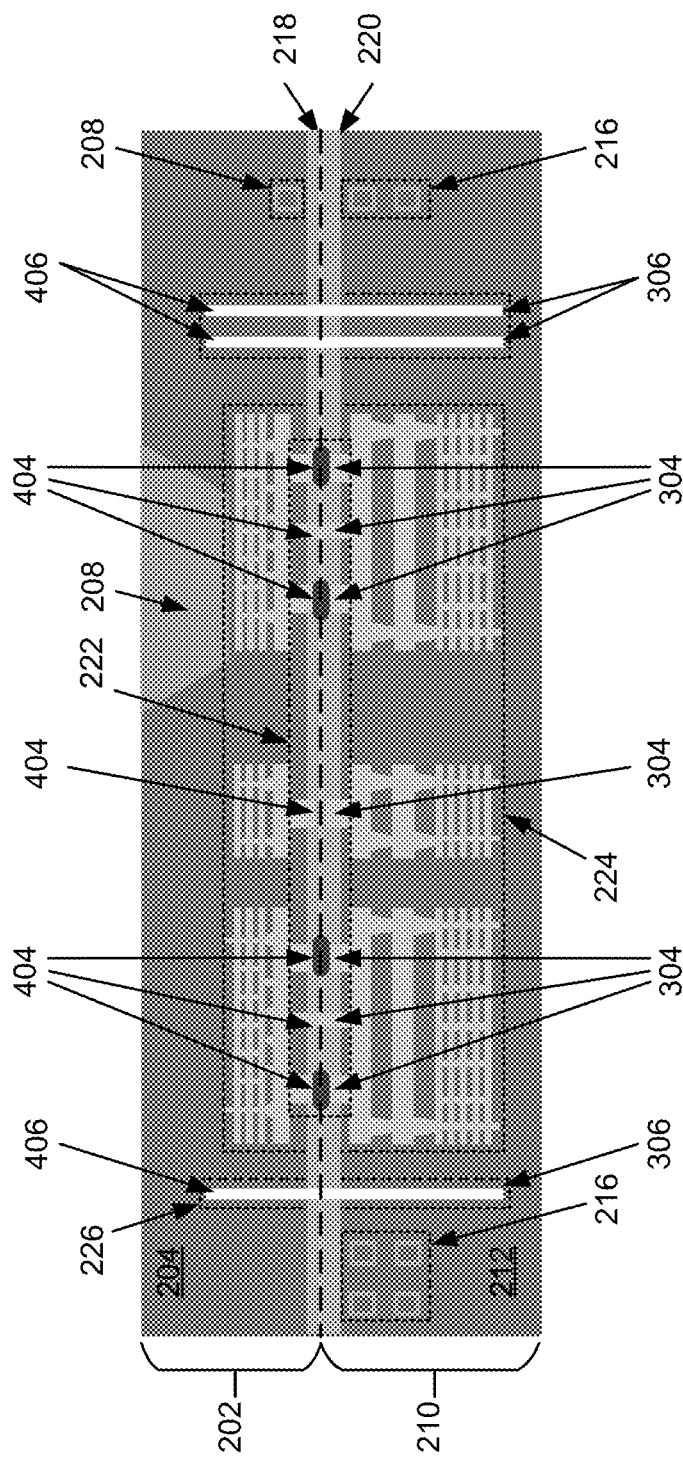

As shown in FIGS. 7H and 7I, a first subset of the set of metal elements 304 may bond to a first subset of the set of metal elements 404 and a second subset of the set of metal elements 304 may be separated from a second subset of the set of metal elements 404. For example, the set of metal elements 404 may include at least one metal element 404 that does not extend to the interface 218 and/or the set of metal elements 304 may include at least one metal element 304 that does not extend to the interface 218. In some implementations, one or more semiconductor tools (e.g., a bonding tool 108 or a deposition tool 102) may deposit solder bumps on one or more elements of the set of metal elements 404 and/or on the set of metal elements 304 before bonding the first wafer 202 to the second wafer 210. In some implementations, the one or more elements of the set of metal element 404 is bonded to the second metal element 304 via a solder bump disposed at the interface 218.

In some implementations, the solder bumps include a solder material, such as tin and silver material, tin, tin and gold material, and/or a lead-free material, among other examples. In some implementations, the solder bumps improve adhesion and/or bonding between the second subset of the set of metal elements 304 and the second subset of the set of metal elements 404 that are separated by the solder bumps.

As indicated above, FIGS. 7A-7I are provided as examples. Other examples may differ from what is described with regard to FIGS. 7A-7I.

Figure 8:
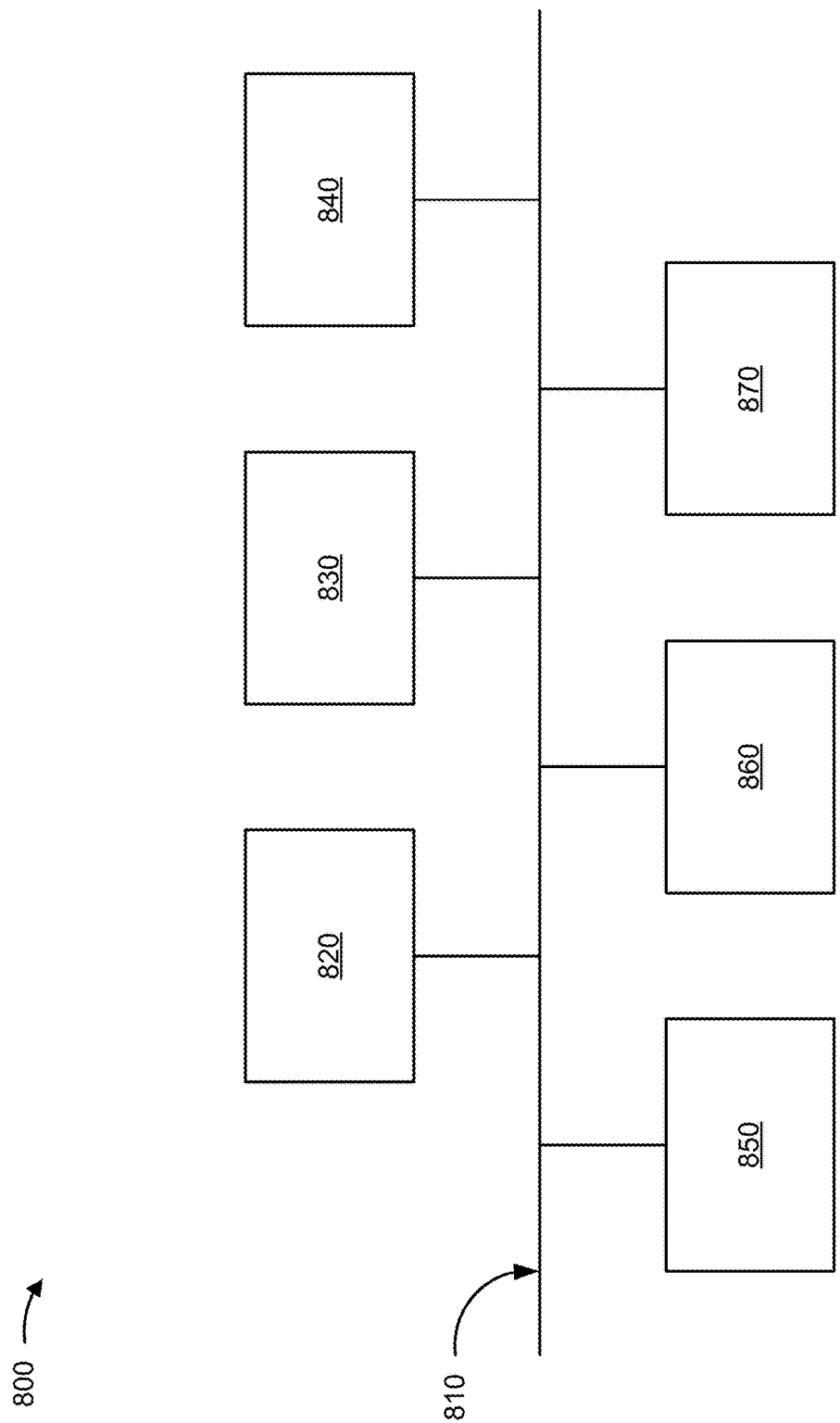
FIG. 8 is a diagram of example components of one or more devices of FIG. 1.

FIG. 8 is a diagram of example components of a device 800, which may correspond to deposition tool 102, etching tool 104, planarization tool 106, bonding tool 108, and/or wafer/die transport tool 110. In some implementations, deposition tool 102, etching tool 104, planarization tool 106, bonding tool 108, and/or wafer/die transport tool 110 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

FIG. 9 is a flowchart of an example process 900 associated with a metal bonding structure and manufacturing method thereof. In some implementations, one or more process blocks of FIG. 9 may be performed by one or more semiconductor processing tools (e.g., deposition tool 102, etching tool 104, planarization tool 106, bonding tool 108, and/or wafer/die transport tool 110). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include forming a first trench adjacent to a first portion of a seal ring structure in a body of a first wafer (block 910). For example, the one or more semiconductor processing tools may form a first trench (e.g., a trench 406) adjacent to a portion of a seal ring structure (e.g., a metal structure 206 of seal ring structure 224) in a body (e.g., a body 204) of a first wafer (e.g., a second wafer 210), as described above.

As further shown in FIG. 9, process 900 may include forming a second trench adjacent to a second portion of the seal ring structure in a body of a second wafer (block 920). For example, the one or more semiconductor processing tools may form a second trench (e.g., trench 406) adjacent to a second portion of the seal ring structure (e.g., a metal structure 214 of the seal ring structure 224) in a body (e.g., the body 212) of a second wafer (e.g., the second wafer 210), as described above.

As further shown in FIG. 9, process 900 may include affixing the first wafer and the second wafer such that an opening of the second trench at least partially overlaps an opening of the first trench (block 930). For example, the one or more semiconductor processing tools may affix the first wafer and the second wafer such that an opening of the second trench at least partially overlaps an opening of the first trench, as described above.

Process 900 may include additional implementations, such as any single implementation or any combination of implementations described below and/or in connection with one or more other processes described elsewhere herein.

In a first implementation, process 900 includes forming a third trench (e.g., a trench 306) adjacent to the first trench in the body of the first wafer, and forming a fourth trench (e.g., trench 406) adjacent to the second trench in the body of the second wafer, wherein the first wafer and the second wafer are affixed such that an opening of the fourth trench at least partially overlaps an opening of the third trench.

In a second implementation, alone or in combination with the first implementation, process 900 includes forming a third trench (e.g., a trench 306) adjacent to the first portion of the seal ring structure in the body of the first wafer, the third trench being on an opposite side of the seal ring structure from the first trench, and forming a fourth trench (e.g., a trench 406) adjacent to the second portion of the seal ring structure in the body of the second wafer, the fourth trench being on an opposite side of the seal ring structure from the second trench, wherein the first wafer and the second wafer are affixed such that an opening of the fourth trench at least partially overlaps an opening of the third trench.

In a third implementation, alone or in combination with any of the first and second implementations, a logical axis at a center of the opening of the second trench is offset from a logical axis at a center of the opening of the first trench.

In a fourth implementation, alone or in combination with any of the first through third implementations, a width of the first trench differs from a width of the second trench.

In a fifth implementation, alone or in combination with any of the first through fourth implementations, the first trench is formed to a depth that extends to or past the first portion of the seal ring structure, and wherein the second trench is formed to a depth that extends to or past the second portion of the seal ring structure.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In some implementations, the trench structure 226 improves reliability of the seal ring structure 224, reduces stress induced in the semiconductor device 200 during a sawing or cutting process, and/or provides protection for the seal ring structure 224 (e.g., from damage during wafer sawing or cutting by acting as a sawing or cutting stop layer). For example, in some implementations, the trench structure 226 reduces stress (e.g., induced due by stress from a die sawing or cutting process) at the interface 218 of the first wafer 202 and the second wafer 210, thereby improving reliability and reducing stress at the interface 218 and, as a result, reducing a likelihood of wafer cracking. As another example, the trench structure 226 may permit some degree of thermal expansion or contraction (e.g., induced due to thermal conditions) of the first wafer 202 or the second wafer 210, thereby improving reliability and reducing stress at the interface 218 and, as a result, reducing a likelihood of wafer cracking. Further, the trench structure 226 can improve contamination prevention (e.g., by preventing contaminants from penetrating the semiconductor device circuit). For these reasons, the trench structure 226 can improve manufacturing yield of the semiconductor device 200 (e.g., a CMOS integrated circuit).

As described in greater detail above, some implementations described herein provide a semiconductor device. The semiconductor device includes a first wafer comprising a first portion of a seal ring structure within a body of the first wafer. The semiconductor device includes a second wafer comprising a second portion of the seal ring structure within a body of the second wafer, where the second wafer is affixed to the first wafer such that the second portion of the seal ring structure is on the first portion of the seal ring structure. The semiconductor device includes a trench structure comprising a first trench in the first wafer and a second trench in the second wafer, where the first trench and the second trench are on a same side of the seal ring structure.

As described in greater detail above, some implementations described herein provide a method. The method includes forming a first trench adjacent to a first portion of a seal ring structure in a body of a first wafer. The method includes forming a second trench adjacent to a second portion of the seal ring structure in a body of a second wafer. The method includes affixing the first wafer and the second wafer such that an opening of the second trench at least partially overlaps an opening of the first trench.

As described in greater detail above, some implementations described herein provide a device. The device includes a first wafer including a first portion of a seal ring structure in a body of the first wafer. The device includes a second wafer including a second portion of the seal ring structure within a body of the second wafer. The device includes a trench structure comprising, a first trench in the first wafer on a first side of the seal ring structure, a second trench in the second wafer on the first side of the seal ring structure, a third trench in the first wafer on the first side of the seal ring structure adjacent to the first trench, and a fourth trench in the second wafer on the first side of the seal ring structure adjacent to the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first wafer comprising a first portion, of a seal ring structure and within a body of the first wafer, comprising a first set of metal elements;
a second wafer comprising a second portion, of the seal ring structure and within a body of the second wafer, comprising a second set of metal elements,
wherein the second wafer is affixed to the first wafer such that a top portion of the second set of metal elements of the second portion of the seal ring structure is directly connected to a top portion of the first set of metal elements of the first portion of the seal ring structure; and
a trench structure comprising a first trench in the first wafer and a second trench in the second wafer,
wherein the first trench and the second trench are on a same side of the seal ring structure and are hollow within.

2. The semiconductor device of claim 1, wherein the trench structure further comprises a third trench in the first wafer and a fourth trench in the second wafer, wherein the third trench and the fourth trench are on the same side of the seal ring structure as the first trench and the second trench.

3. The semiconductor device of claim 1, wherein the trench structure further comprises a third trench in the first wafer and a fourth trench in the second wafer, wherein the third trench and the fourth trench are on an opposite side of the seal ring structure from the first trench and the second trench.

4. The semiconductor device of claim 1, wherein an opening of the second trench at least partially overlaps an opening of the first trench.

5. The semiconductor device of claim 1, wherein a width of the first trench is different from a width of the second trench.

6. The semiconductor device of claim 1, wherein the second trench has a depth that extends at least to a surface of the second portion of the seal ring structure.

7. The semiconductor device of claim 1, wherein the second wafer includes a semiconductor structure formed at a first surface of the second wafer, and
wherein the second trench extends from a second surface of the second wafer past a surface of the semiconductor structure.

8. The semiconductor device of claim 1, wherein a depth of the first trench causes the first trench to extend at least to a surface of the first portion of the seal ring structure.

9. The semiconductor device of claim 1, wherein the second wafer is directly affixed to the first wafer via bond region.

10. A method, comprising:
forming a first trench, adjacent to a first portion of a seal ring structure and defining an opening, in a body of a first wafer;
forming a second trench, adjacent to a second portion of the seal ring structure and defining an opening, in a body of a second wafer,
wherein a width, of the opening of the first trench, at a surface of the first wafer is different, than a width, of the opening of the second trench, at a surface of the second wafer; and
affixing the first wafer and the second wafer such that the opening of the second trench at least partially overlaps the opening of the first trench and that the second trench and the first trench are hollow within.

11. The method of claim 10, further comprising:
forming a third trench, adjacent to the first trench, in the body of the first wafer; and
forming a fourth trench, adjacent to the second trench, in the body of the second wafer,
wherein the first wafer and the second wafer are affixed such that an opening of the fourth trench at least partially overlaps an opening of the third trench.

12. The method of claim 10, further comprising:
forming a third trench, adjacent to the first portion of the seal ring structure, in the body of the first wafer, wherein the third trench is on an opposite side of the seal ring structure from the first trench; and
forming a fourth trench, adjacent to the second portion of the seal ring structure, in the body of the second wafer, wherein the fourth trench is on an opposite side of the seal ring structure from the second trench, and
wherein the first wafer and the second wafer are affixed such that an opening of the fourth trench at least partially overlaps an opening of the third trench.

13. The method of claim 10, wherein a logical axis at a center of the opening of the second trench is offset from a logical axis at a center of the opening of the first trench.

14. The method of claim 10, wherein the first trench is formed to a depth that extends to or past the first portion of the seal ring structure, and
wherein the second trench is formed to a depth that extends to or past the second portion of the seal ring structure.

15. A device, comprising:
a first wafer including a first portion, of a seal ring structure, in a body of the first wafer;
a second wafer including a second portion, of the seal ring structure, within a body of the second wafer; and
a trench structure comprising:
a first trench, defining an opening, in the first wafer and on a first side of the seal ring structure,
a second trench, defining an opening, in the second wafer and on the first side of the seal ring structure,
a third trench, defining an opening, in the first wafer and on the first side of the seal ring structure, wherein the third trench is adjacent to the first trench, and
a fourth trench, defining an opening, in the second wafer and on the first side of the seal ring structure, wherein the fourth trench is adjacent to the second trench,
wherein at least one of:
a width, of the opening of the first trench, at a surface of the first wafer is different, than a width, of the opening of the second trench, at a surface of the second wafer, or
a width, of the opening of the third trench, at a surface of the first wafer is different, than a width, of the opening of the fourth trench, at a surface of the second wafer, and
wherein at least one of the first trench, the second trench, the third trench, or the fourth trench is hollow within.

16. The device of claim 15, wherein the trench structure further comprises:
   a fifth trench, in the first wafer, on a second side of the seal ring structure that is opposite from the first side of the seal ring structure, and
   a sixth trench, in the second wafer, on the second side of the seal ring structure.

17. The device of claim 15, wherein the opening of the first trench at least partially overlaps the opening of the second trench and opening of the third trench at least partially overlaps the opening of the fourth trench.

18. The device of claim 15, wherein the opening of the first trench is adjacent to and does not overlap with the opening of the second trench and the opening of the third trench is adjacent to and does not overlap with the opening of the fourth trench.

19. The device of claim 15, wherein the width of the first trench is different from the width of the second trench, or
   the width of the third trench is different from the width of the fourth trench.

20. The device of claim 15, wherein at least one trench of the trench structure has a sloped side-surface.

\* \* \* \* \*